US012610729B2

(12) United States Patent
Kim et al.

(10) Patent No.: US 12,610,729 B2
(45) Date of Patent: Apr. 21, 2026

(54) DISPLAY DEVICE

(71) Applicant: LG Display Co., Ltd., Seoul (KR)

(72) Inventors: DongYoon Kim, Paju-si (KR); Gyujae Yohn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 780 days.

(21) Appl. No.: 17/964,892

(22) Filed: Oct. 12, 2022

(65) Prior Publication Data

US 2023/0209982 A1 Jun. 29, 2023

(30) Foreign Application Priority Data

Dec. 24, 2021 (KR) ........................ 10-2021-0187157

(51) Int. Cl.
H10K 77/10 (2023.01)
H10K 50/86 (2023.01)
(Continued)

(52) U.S. Cl.
CPC ........... H10K 77/111 (2023.02); H10K 50/86 (2023.02); H10K 59/131 (2023.02); H10K 71/80 (2023.02);
(Continued)

(58) Field of Classification Search
CPC .... H10K 77/111; H10K 50/86; H10K 59/131; H10K 71/80; H10K 59/1201; H10K 2102/311; H10K 50/841; H10K 59/351; H10D 30/6755; H10D 86/423; H10D 86/60
See application file for complete search history.

(56) References Cited

U.S. PATENT DOCUMENTS

| | | |
|---|---|---|
| 9,740,035 B2 | 8/2017 | Kwon et al. |
| 10,247,971 B2 | 4/2019 | Kwon et al. |
| | (Continued) | |

FOREIGN PATENT DOCUMENTS

| | | |
|---|---|---|
| KR | 10-1296263 B1 | 8/2013 |
| KR | 10-2014-0103025 A | 8/2014 |
| KR | 10-2019-0028594 A | 3/2019 |

OTHER PUBLICATIONS

European Patent Office, Extended European Search Report, European Patent Application No. 22202631.2, May 24, 2023, eight pages.

*Primary Examiner* — Britt Hanley
*Assistant Examiner* — William C. Trice, III
(74) *Attorney, Agent, or Firm* — Fenwick & West LLP

(57) ABSTRACT

According to an exemplary embodiment of the present disclosure, a display device includes a substrate which includes an active area including a plurality of sub pixels and a non-active area and is formed of one of transparent conducting oxide and an oxide semiconductor layer, a film member disposed below the substrate, an adhesive layer disposed between the film member and the substrate, and an insulating layer disposed on the substrate, the substrate includes a plurality of substrate patterns, and an air gap defined by the plurality of substrate patterns, the insulating layer, and the adhesive layer is disposed on the adhesive layer. Accordingly, the tearing defect of the substrate by the LLO process is suppressed and the generation and the propagation of the crack generated when the display device is bent or folded may be minimized.

26 Claims, 16 Drawing Sheets

SPR

(51) Int. Cl.

| | |
|---|---|
| *H10K 59/12* | (2023.01) |
| *H10K 59/131* | (2023.01) |
| *H10K 71/80* | (2023.01) |
| *H10K 102/00* | (2023.01) |

(52) U.S. Cl.

CPC .... *H10K 59/1201* (2023.02); *H10K 2102/311* (2023.02)

(56) References Cited

U.S. PATENT DOCUMENTS

| | | | |
|---|---|---|---|
| 10,600,824 B2 | 3/2020 | Lee et al. | |
| 11,183,521 B2 | 11/2021 | Lee et al. | |
| 2014/0232956 A1 | 8/2014 | Kwon et al. | |
| 2015/0108475 A1 | 4/2015 | Ando et al. | |
| 2017/0315399 A1 | 11/2017 | Kwon et al. | |
| 2018/0286938 A1* | 10/2018 | Moon | H10K 59/124 |
| 2019/0081090 A1 | 3/2019 | Lee et al. | |
| 2019/0305081 A1 | 10/2019 | LaJoie et al. | |
| 2020/0219907 A1 | 7/2020 | Lee et al. | |
| 2021/0376038 A1* | 12/2021 | Won | H10K 59/1213 |
| 2021/0384314 A1 | 12/2021 | Yamazaki et al. | |
| 2022/0058990 A1* | 2/2022 | Yoo | H10K 50/844 |

\* cited by examiner

CF(CFR,CFG,CFB)
DL(DL1,DL2,DL3,DL4)
DP(TR1,TR2,TR3,SC)

DISPLAY DEVICE

CROSS-REFERENCE TO RELATED APPLICATIONS

This application claims the priority of Korean Patent Application No. 10-2021-0187157 filed on Dec. 24, 2021, in the Korean Intellectual Property Office, the disclosure of which is incorporated herein by reference.

BACKGROUND

Field

The present disclosure relates to a display device, and more particularly, to a display device in which a tearing defect of a substrate during a laser lift-off (LLO) process is suppressed and the generation and propagation of the crack of the display device are minimized.

Description of the Related Art

As display devices which are used for a monitor of a computer, a television, or a cellular phone, there is an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material so as to be capable of displaying images even though the display device is folded or rolled is getting attention as a next generation display device.

SUMMARY

An object to be achieved by the present disclosure is to provide a display device which uses one of a transparent conducting oxide layer and an oxide semiconductor layer as a substrate, instead of a plastic substrate.

Another object to be achieved by the present disclosure is to provide a display device which minimizes permeation of moisture and oxide.

Still another object to be achieved by the present disclosure is to provide a display device which removes a plastic substrate to simplify a process and reduce a manufacturing cost.

Still another object to be achieved by the present disclosure is to provide a display device which minimizes a parasitic capacitance by a substrate formed of one of a transparent conducting oxide layer and an oxide semiconductor layer.

Another object to be achieved by the present disclosure is to provide a display device in which the generation and propagation of the crack are suppressed.

Another object to be achieved by the present disclosure is to provide a display device in which a tearing defect of a substrate during a laser lift-off (LLO) process is suppressed.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device includes a substrate which includes an active area including a plurality of sub pixels and a non-active area and is formed of one of a transparent conducting oxide layer and an oxide semiconductor layer; a film member disposed below the substrate; an adhesive layer disposed between the film member and the substrate, and an insulating layer disposed on the substrate, the substrate includes a plurality of substrate patterns, and an air gap defined by the plurality of substrate patterns, the insulating layer, and the adhesive layer is disposed on the adhesive layer. Accordingly, the tearing defect of the substrate due to the LLO process may be suppressed.

In order to achieve the above-described objects, according to another aspect of the present disclosure, a display device includes a substrate which includes an active area including a plurality of sub pixels and a non-active area adjacent to the active area and including a gate driver and a pad unit and is formed of one of a transparent conducting oxide layer and an oxide semiconductor layer; a film member disposed below the substrate; an adhesive layer disposed between the film member and the substrate, and an insulating layer disposed on the substrate, in the non-active area, a plurality of first wiring lines which transmits a signal from the pad unit to the gate driver, a plurality of second wiring lines which connects the gate driver and the plurality of first wiring lines, and a plurality of third wiring lines which transmits a signal from the pad unit to the plurality of sub pixels are disposed, the active area includes an emission area and a circuit area, the substrate includes a plurality of substrate patterns disposed in an area overlapping the plurality of first wiring lines, the plurality of second wiring lines, and the plurality of third wiring lines and an emission area, and an air gap defined by the plurality of substrate patterns, the insulating layer, and the adhesive layer is disposed on the adhesive layer. Accordingly, a parasitic capacitance is minimized, and the generation and the propagation of the crack generated when the display is bent or folded may be minimized.

In still another embodiment, a display device comprises a substrate which includes an active area including a plurality of sub pixels and a non-active area, the substrate formed of one of a transparent conducting oxide layer and an oxide semiconductor layer and including a plurality of substrate patterns; a film member disposed below the substrate; an insulating layer disposed on the substrate; and an airgap disposed between the insulating layer and the film member.

Other detailed matters of the exemplary embodiments are included in the detailed description and the drawings.

According to the present disclosure, a transparent conducting oxide layer and an oxide semiconductor layer are used as a substrate of the display device to easily control a moisture permeability.

According to the present disclosure, a thin transparent conducting oxide layer and an oxide semiconductor layer are used as a substrate of the display device to improve a flexibility of the display device.

According to the present disclosure, a thin transparent conducting oxide layer and a thin oxide semiconductor layer are used as substrates of a display device to relieve a stress generated when the display device is bent or rolled and reduce a crack of the display device.

According to the present disclosure, a transparent conducting oxide layer and an oxide semiconductor layer are used as substrates of the display device to simplify a structure of the display device and reduce a manufacturing cost.

According to the present disclosure, a transparent conducting oxide layer and an oxide semiconductor layer are used as substrates of the display device to reduce the generation of static electricity and improve a display quality.

According to the present disclosure, the substrate of the display device is manufactured by a deposition process under a vacuum environment so that a substrate manufacturing time is shortened, and foreign materials formed on the substrate and a defect thereby may be minimized.

According to the present disclosure, a substrate of the display device configured by a transparent conducting oxide layer and an oxide semiconductor layer is patterned to minimize the tearing defect of the substrate during the LLO process.

According to the present disclosure, a substrate pattern which is formed of a transparent conducting oxide layer and an oxide semiconductor layer is disposed only in an emission area to minimize the parasitic capacitance and improve the driving reliability.

According to the present disclosure, the generation of crack due to the deformation of the substrate under the high temperature and high humidity environment may be suppressed by the substrate pattern and the air gap disposed in the display device.

According to the present disclosure, the shearing stress is blocked by the substrate pattern and the air gap disposed in the gate driver to suppress the propagation of the crack.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
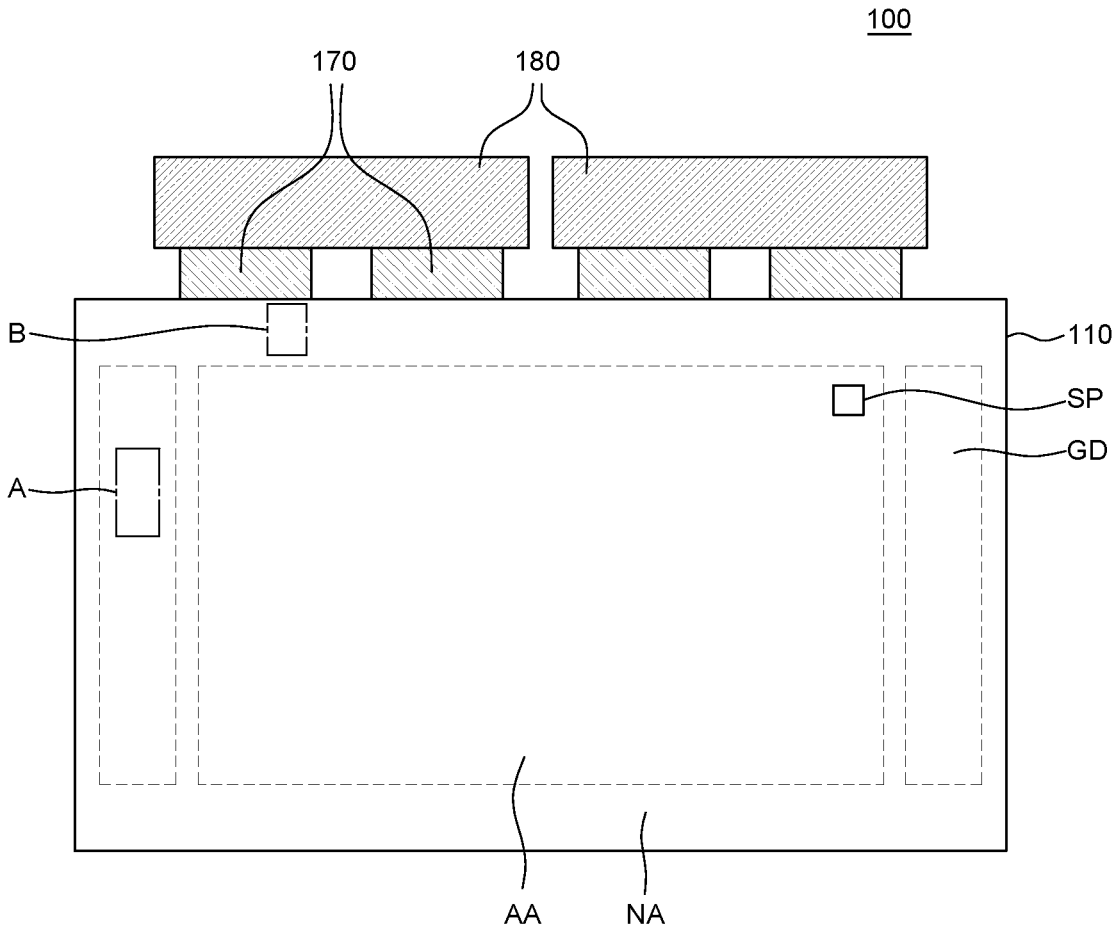
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

Figure 2:
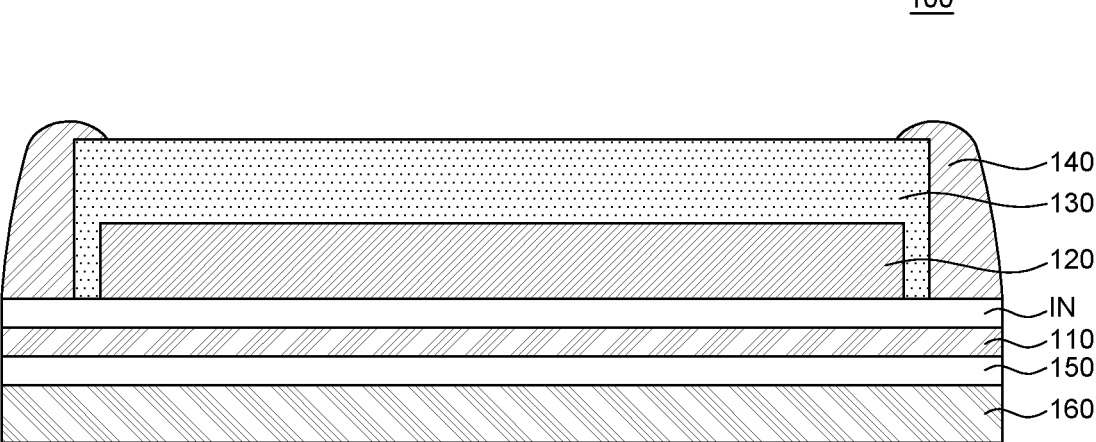
FIG. 2 is a schematic cross-sectional view of a display device according to an exemplary embodiment of the present disclosure.

FIG. 1 is a plan view of a display device according to an exemplary embodiment of the present disclosure. FIG. 2 is a schematic cross-sectional view of a display device according to an exemplary embodiment of the present disclosure. For the convenience of description, in FIG. 1, among various components of the display device 100, only a substrate 110, a plurality of flexible films 170, and a plurality of printed circuit boards 180 are illustrated.

Referring to FIGS. 1 and 2, the substrate 110 is a support member which supports other components of the display device 100. The substrate 110 may be formed of any one of a transparent conducting oxide and an oxide semiconductor. For example, the substrate 110 may be formed of a transparent conducting oxide (TCO), such as indium tin oxide (ITO), indium zinc oxide (IZO), or indium tin zinc oxide (ITZO).

Further, the substrate 110 may be formed of an oxide semiconductor material formed of indium (In) and gallium (Ga), for example, a transparent oxide semiconductor, such as indium gallium zinc oxide (IGZO), indium gallium oxide (IGO), and indium tin zinc oxide (ITZO). However, a type of a material of the transparent conducting oxide and the oxide semiconductor is illustrative so that the substrate 110 may be formed by another transparent conducting oxide and oxide semiconductor material which have not been described in the specification and is not limited thereto.

In the meantime, the substrate 110 may be formed by depositing the transparent conducting oxide or an oxide semiconductor with a very thin thickness. Therefore, as the substrate 110 is formed to have a very thin thickness, the substrate has a flexibility. A display device including a substrate 110 having a flexibility may be implemented as a flexible display device 100 which displays an image even in a folded or rolled state. For example, when the display device 100 is a foldable display device, the substrate 110 is folded or unfolded with respect to a folding axis. As another example, when the display device 100 is a rollable display device, the display device may be stored by being rolled around the roller. Accordingly, the display device 100 according to the exemplary embodiment of the present disclosure uses a substrate 110 having a flexibility to be implemented as a flexible display device 100 like a foldable display device or a rollable display device.

Further, the display device 100 according to the exemplary embodiment of the present disclosure uses a substrate 110 formed of a transparent conducting oxide or an oxide semiconductor to perform a LLO process. The LLO process refers to a process of separating a temporary substrate below the substrate 110 from the substrate 110 using laser during the manufacturing process of a display device 100. Accordingly, the substrate 110 is a layer for more easily performing the LLO process so that it is referred to as a functional thin film, a functional thin film layer, or a functional substrate. The LLO process will be described below in more detail.

The substrate 110 includes an active area AA and a non-active area NA.

The active area AA is an area where images are displayed. In the active area AA, a pixel unit 120 configured by a plurality of sub pixels may be disposed to display images. For example, the pixel unit 120 is configured by a plurality of sub pixels including a light emitting diode and a driving circuit to display images.

The non-active area NA is an area where no image is displayed and various wiring lines and driving ICs for driving the sub pixels disposed in the active area AA are disposed. For example, in the non-active area NA, various driving ICs, such as a gate driver IC and a data driver IC, may be disposed.

The plurality of flexible films 170 is disposed at one end of the substrate 110. The plurality of flexible films 170 are electrically connected to one end of the substrate 110. The plurality of flexible films 170 are films in which various components are disposed on a base film having a malleability to supply signals to the plurality of sub pixels of the active area AA. One ends of the plurality of flexible films 170 are disposed in the non-active area NA of the substrate 110 to supply a data voltage to the plurality of sub pixels of the active area AA. In the meantime, even though four flexible films 170 are illustrated in FIG. 1, the number of flexible films 170 may vary depending on the design but is not limited thereto.

In the meantime, a driving IC, such as a gate driver IC or a data driver IC, may be disposed on the plurality of flexible films 170. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 170 by a chip on film technique but is not limited thereto.

The printed circuit board 180 is connected to the plurality of flexible films 170. The printed circuit board 180 is a component which supplies signals to the driving IC. Various components may be disposed on the printed circuit board 180 to supply various driving signals, such as a driving signal or a data voltage, to the driving IC. In the meantime, even though two printed circuit boards 180 are illustrated in FIG. 1, the number of printed circuit boards 180 may vary depending on the design and is not limited thereto.

Referring to FIG. 2, an insulating layer IN is disposed on the substrate 110. The insulating layer IN suppresses moisture and/or oxygen which penetrates from the outside of the substrate 110 from being spread. The moisture permeation characteristic of the display device 100 may be controlled by controlling a thickness or a lamination structure of the insulating layer IN. Further, the insulating layer IN may suppress a short defect from being caused when the substrate 110 formed of a transparent conducting oxide or an oxide semiconductor is in contact with the other configurations such as the pixel unit 120. The insulating layer IN may be formed of an inorganic material, and for example, may be configured by a single layer or a double layer of silicon oxide SiOx and silicon nitride SiNx, but is not limited thereto.

The pixel unit 120 is disposed on the insulating layer IN. The pixel unit 120 may be disposed so as to correspond to the active area AA. The pixel unit 120 is a component which includes a plurality of sub pixels to display images. The plurality of sub pixels of the pixel unit 120 are minimum units which configure the active area AA and a light emitting diode and a driving circuit may be disposed in each of the plurality of sub pixels. For example, the light emitting diode of each of the plurality of sub pixels may include an organic light emitting diode including an anode, an organic emission layer, and a cathode or an LED including N-type and P-type semiconductor layers and an emission layer. The driving circuit for driving the plurality of sub pixels may include a driving element, such as a thin film transistor or a storage capacitor but is not limited thereto. Hereinafter, for convenience of description, it is assumed that the light emitting diode of each of the plurality of sub pixels is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the substrate 110 on which the light emitting diode is disposed. In the case of the top emission type, a reflective layer may be formed below the anode to allow the light emitted from the organic light emitting diode to travel to the upper portion of the substrate 110, that is, toward the cathode.

According to the bottom emission type, light emitted from the light emitting diode is emitted to a lower portion of the substrate 110 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the substrate 110.

Hereinafter, for the convenience of description, the description will be made by assuming that the display device 100 according to an exemplary embodiment of the present disclosure is a bottom emission type display device, but it is not limited thereto.

An encapsulation layer 130 is disposed to cover the pixel unit 120. The encapsulation layer 130 seals the pixel unit 120 to protect the light emitting diode of the pixel unit 120 from moisture, oxygen, and impacts of the outside. The encapsulation unit 130 may be configured by thin film encapsulation (TFE) formed by alternately laminating a plurality of inorganic layer and a plurality of organic layers. For example, the inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto. Further, the encapsulation layer 130 may be configured by a face seal type. For example, the encapsulation layer 130 may be formed by forming ultra-violet or thermosetting sealant on the entire surface of the pixel unit 120. However, the structure of the encapsulation layer 130 may be formed by various methods and materials but is not limited thereto.

In the meantime, an encapsulation substrate which has a high modulus and is formed of a metal material having a strong corrosion resistance may be further disposed on the encapsulation layer 130. For example, the encapsulation substrate may be formed of a material having a high modulus of approximately 200 to 900 MPa. The encapsulation substrate may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the encapsulation substrate is formed of a metal material, the encapsulation substrate may be implemented as an ultra-thin film and provide a strong resistance against external impacts and scratches.

A seal member 140 is disposed so as to enclose side surfaces of the pixel unit 120 and the encapsulation layer 130. The seal member 140 is disposed in the non-active area NA and is disposed to enclose the pixel unit 120 disposed in the active area AA. The seal member 140 is disposed so as to enclose a side surface of the pixel unit 120 and a side surface of the encapsulation layer 130 to minimize the moisture permeation to the pixel unit 120. For example, the seal member 140 may be disposed so as to cover an upper surface of the insulating layer IN which overlaps the non-active area NA and protrudes to the outside of the pixel unit 120, a side surface of the encapsulation layer 130 disposed to enclose the pixel unit 120, and a part of an upper surface of the encapsulation layer 130.

The seal member 140 may be formed of a non-conducting material having an elasticity so as to encapsulate the side surface of the pixel unit 120 and reinforce the rigidity of the side surface of the display device 100. Further, the seal member 140 may be formed of a material having an adhesiveness. The seal member 140 may further include an absorbent which absorbs moisture and oxygen from the outside to minimize the moisture permeation through the side portion of the display device 100. For example, the seal member 140 may be formed of polyimide (PI), poly ure-thane, epoxy, or acryl based material, but is not limited thereto.

A film member 160 is disposed below the substrate 110. The film member 160_may include at least one of a polarizer or a barrier film. For example in FIG. 2, the polarizer is shown as an example of the film member 160, which is disposed below the substrate 110. The polarizer 160 selectively transmits light to reduce the reflection of external light which is incident onto the substrate 110. Specifically, in the display device 100, various metal materials which are applied to semiconductor devices, wiring lines, and light emitting diodes is formed on the substrate 110. Therefore, the external light incident onto the substrate 110 may be reflected from the metal material so that the visibility of the display device 100 may be reduced due to the reflection of the external light. At this time, the polarizer 160 which suppresses the reflection of external light is disposed below the substrate 110 to increase outdoor visibility of the display device 100. However, the polarizer 160 may be omitted depending on an implementation example of the display device 100.

In the meantime, a barrier film (not shown herein) may be disposed below the substrate 110 together with the polarizer 160 or in a state in which the polarizer 160 is omitted. The barrier film minimizes the permeation of the moisture and oxygen outside the substrate 110 into the substrate 110 to protect the pixel unit 120 including a light emitting diode. However, the barrier film may be omitted depending on an implementation example of the display device 100, but it is not limited thereto.

An adhesive layer 150 is disposed between the film member 160 and the substrate 110. The adhesive layer 150 is formed of a material having an adhesiveness and may be a thermosetting or naturally curable type adhesive. For example, the adhesive layer 150 may be formed of an optical clear adhesive (OCA) or a pressure sensitive adhesive (PSA), but is not limited thereto.

Hereinafter, the plurality of sub pixels of the pixel unit 120 will be described in more detail with reference to FIGS. 3 to 5.

Figure 3:
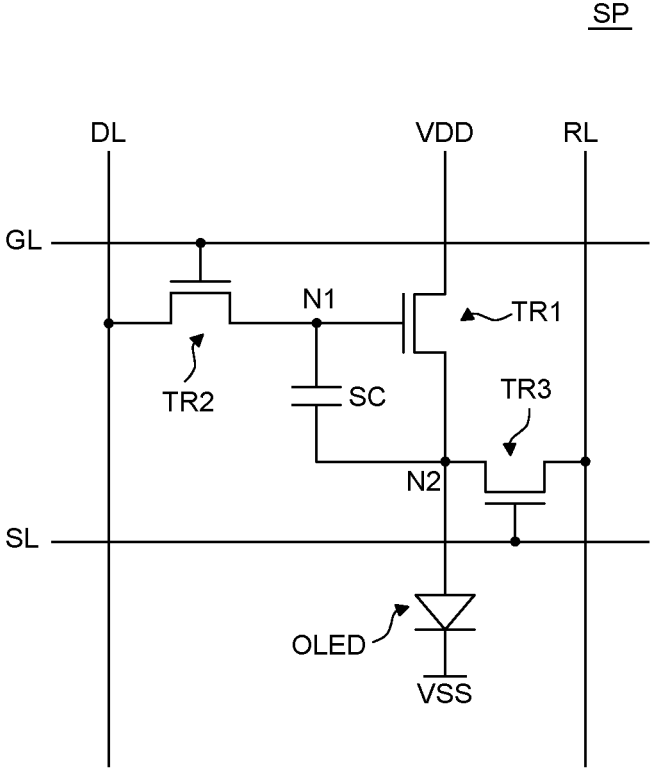
FIG. 3 is a circuit diagram of a sub pixel of a display device according to an exemplary embodiment of the present disclosure.

FIG. 3 is a circuit diagram of a sub pixel of a display device according to an exemplary embodiment of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL is disposed on the substrate 110.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current flows from the source electrode to the drain electrode. Since in the N-type thin film transistor, electrons flow from the source electrode to the drain electrode, the current flows from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 is turned on and when the voltage of the first node N1 is lower than the threshold voltage, the first transistor TR1 is turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of a plurality of capacitor electrodes is connected to the first node N1 and the other one is connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the exemplary embodiment of the present disclosure has a 3T1C structure including three transistors and one storage capacitor SC. However, the number and a connection relationship of the transistors and the storage capacitor may vary in various ways depending on the design and are not limited thereto.

Figure 4A:
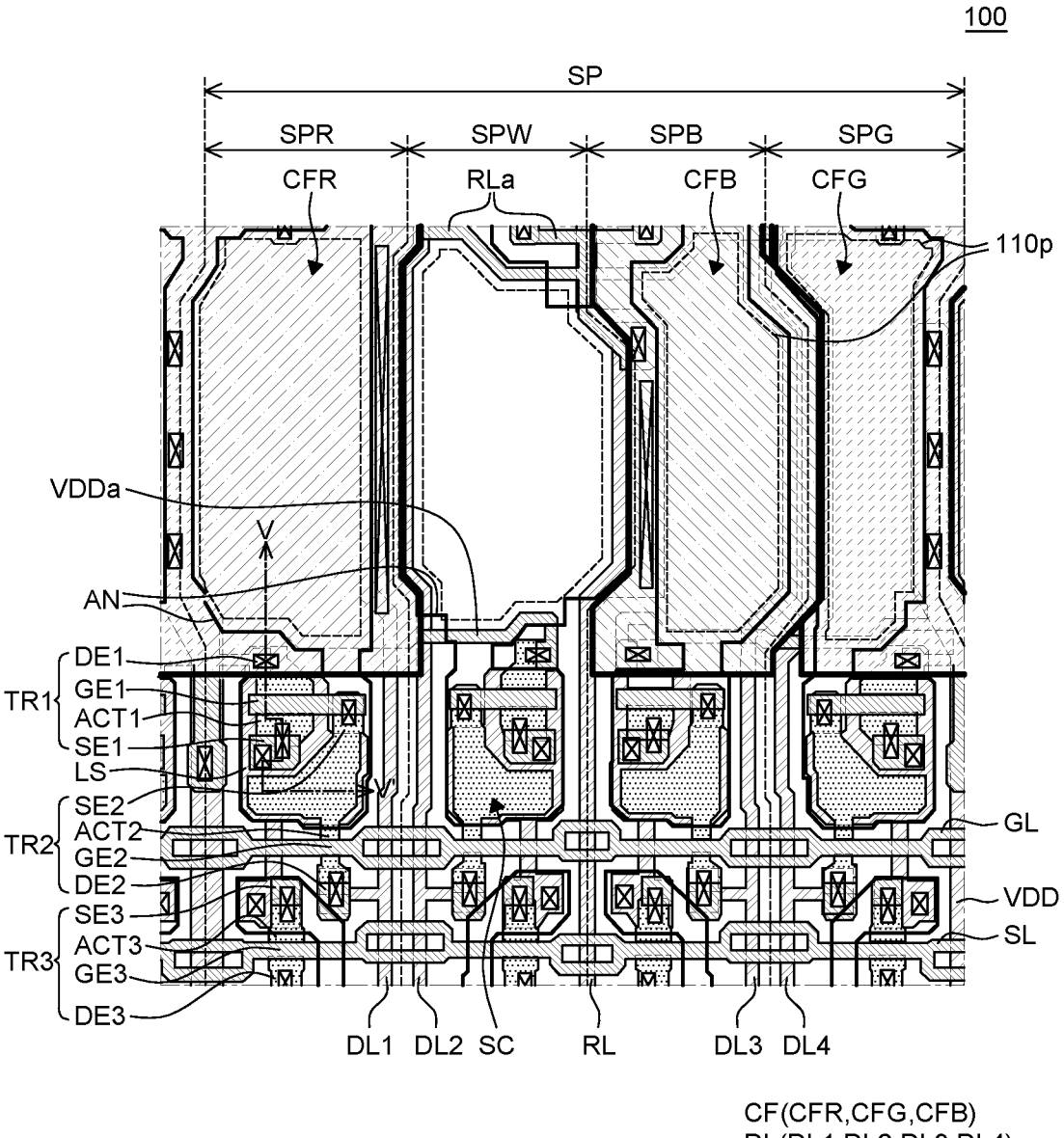
FIGS. 4A and 4B are enlarged plan views of a display device according to an exemplary embodiment of the present disclosure.
Figure 4B:
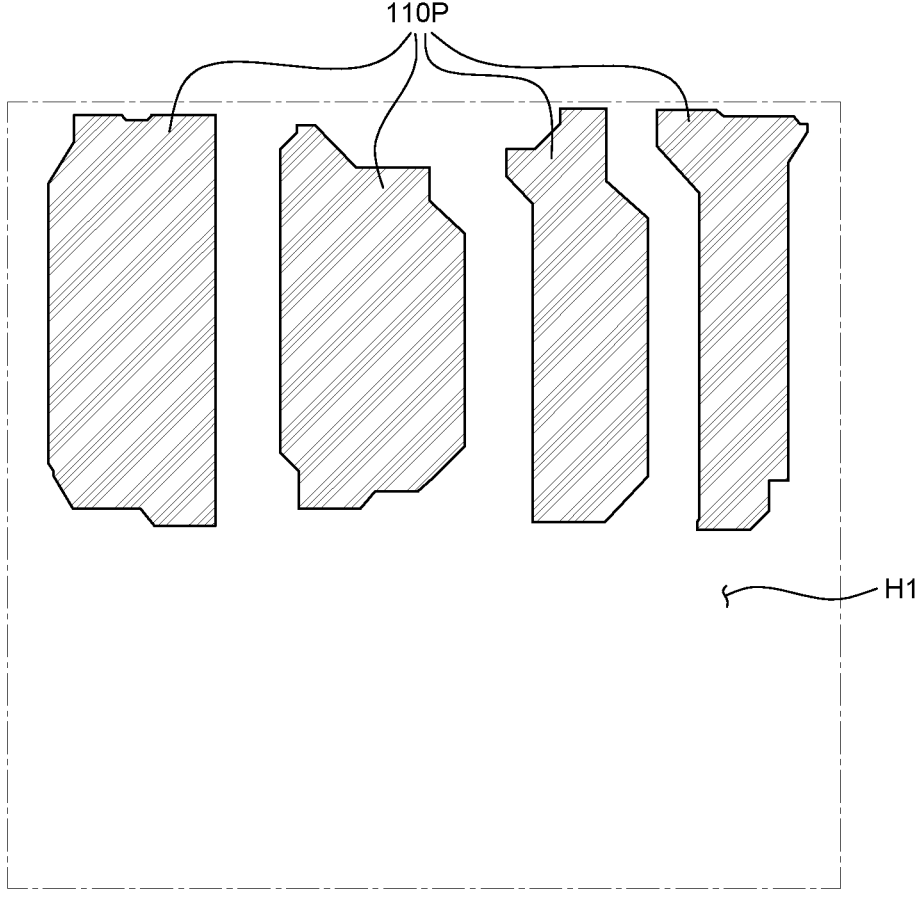

FIGS. 4A and 4B are enlarged plan views of a display device according to an exemplary embodiment of the present disclosure. FIG. 5 is a cross-sectional view taken along the line V-V' of FIG. 4A. FIG. 4A is an enlarged plan view of a red sub pixel SPR, a white sub pixel SPW, a blue sub pixel SPB, and a green sub pixel SPG which configure one pixel. In FIG. 4A, for the convenience of description, a bank 115 is omitted and edges of the plurality of color filters CF are illustrated with a bold solid line. FIG. 4B is an enlarged plan view of a substrate 110 of a display device 100 according to an exemplary embodiment of the present disclosure. Referring to FIGS. 4A, 4B, and 5, the display device 100 according to the exemplary embodiment of the present disclosure includes a substrate 110, an insulating layer IN, a buffer layer 111, a gate insulating layer 112, a passivation layer 113, an over coating layer 114, a bank 115, an adhesive layer 150, a polarizer 160, a first transistor TR1, a second transistor TR2, a third transistor TR3, a storage capacitor SC, a light emitting diode OLED, a gate line GL, a sensing line SL, a data line DL, a reference line RL, a high potential power line VDD, and a plurality of color filters CF.

Referring to FIG. 4A, the plurality of sub pixels SP include a red sub pixel SPR, a green sub pixel SPG, a blue sub pixel SPB, and a white sub pixel SPW. For example, the red sub pixel SPR, the white sub pixel SPW, the blue sub pixel SPB, and the green sub pixel SPG may be sequentially disposed along a row direction. However, the placement order of the plurality of sub pixels SP is not limited thereto.

Each of the plurality of sub pixels SP includes an emission area EA and a circuit area CA. The emission area EA is an area where one color light is independently emitted and the light emitting diode OLED may be disposed therein. Specifically, an area of an overlapping area of the plurality of color filters CF and the anode AN which is exposed from the bank 115 to allow light emitted from the light emitting diode OLED to travel the outside is defined as an emission area EA. For example, referring to FIGS. 4A and 5, an emission area EA of the red sub pixel SPR is an area exposed from the bank 115 in an area in which the red color filter CFR and the anode AN overlap. An emission area EA of the green sub pixel SPG is an area exposed from the bank 115 in an area in which the green color filter CFG and the anode AN overlap. An emission area EA of the blue sub pixel SPB is an area exposed from the bank 115 in an area in which the blue color filter CFB and the anode AN overlap. At this time, an emission area EA of the white sub pixel SPW in which a separate color filter CF is not disposed may be a white emission area which emits white light, in an area overlapping a part of the anode AN exposed from the bank 115.

The circuit area CA is an area excluding the emission area EA and a driving circuit DP for driving the plurality of light emitting diodes OLED and a plurality of wiring lines which transmit various signals to the driving circuit DP may be disposed. The circuit area CA in which the driving circuit DP, the plurality of wiring lines, and the bank 115 are disposed may be a non-emission area. For example, in the circuit area CA, the driving circuit DP including the first transistor TR1, the second transistor TR2, the third transistor TR3, and the storage capacitor SC, a plurality of high potential power lines VDD, a plurality of data lines DL, a plurality of reference lines RL, a plurality of gate lines GL, a sensing line SL, and the bank 115 are disposed.

Referring to FIGS. 3, 4A, 4B, and 5, the substrate 110 includes a plurality of substrate patterns 110P. The plurality of substrate patterns 110P may be disposed so as to overlap the emission area EA. That is, the plurality of substrate patterns 110P may be disposed only in the emission area EA between the emission area EA and the circuit area CA and may not overlap the plurality of thin film transistors TR1, TR2, TR3, the storage capacitor SC, and various wiring lines disposed in the circuit area CA. Therefore, the plurality of substrate patterns 110P may have the same shape as the emission area EA, but is not limited thereto.

An air gap H1 is disposed in a space between the plurality of substrate patterns 110P. The air gap H1 may be defined by the plurality of substrate patterns 110P, the insulating layer IN, and the adhesive layer 150. That is, the air gap H1 is an area enclosed by the plurality of substrate patterns 110P, the insulating layer IN, and the adhesive layer 150 and may be disposed on the adhesive layer 150.

Figure 5:
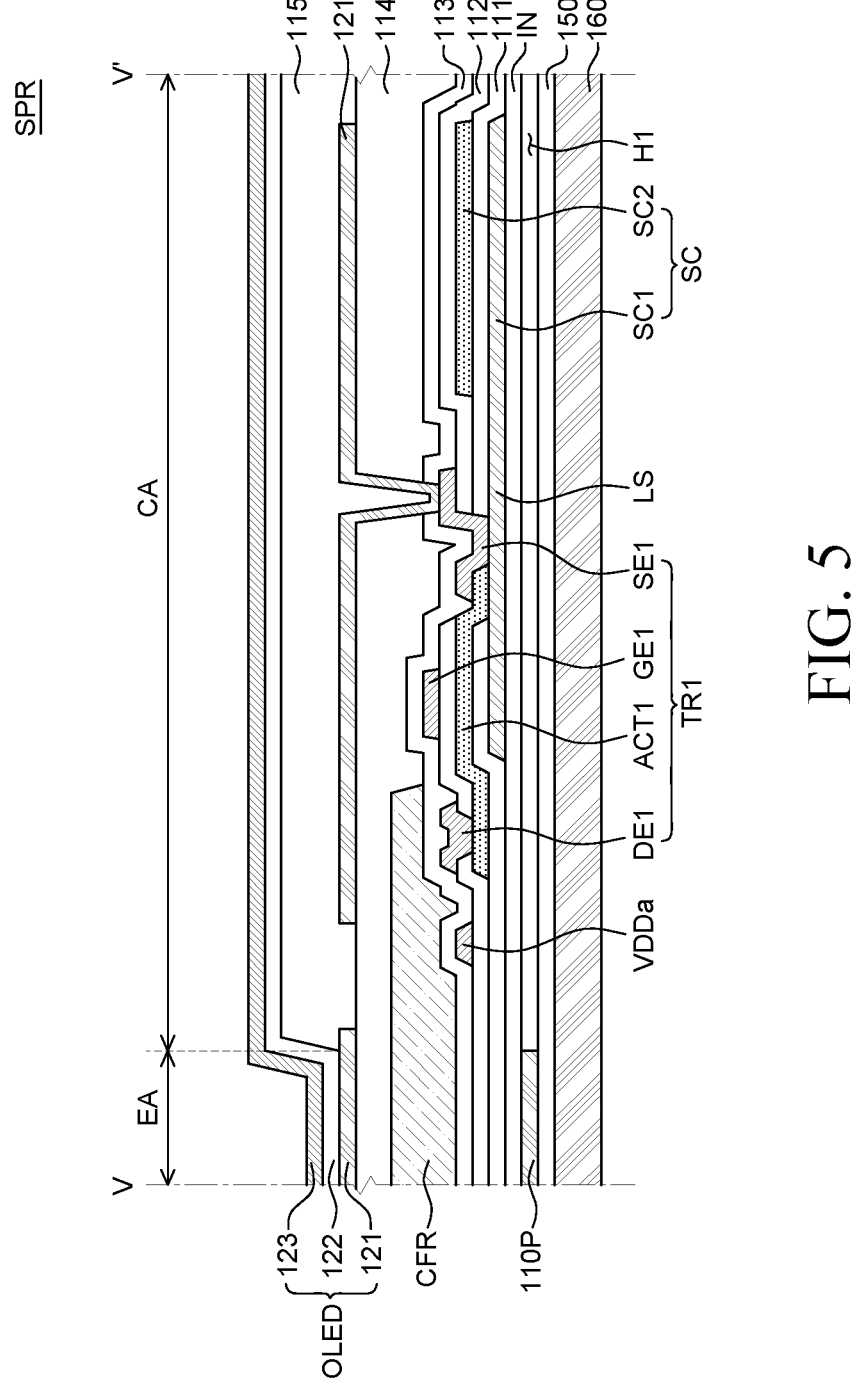
FIG. 5 is a cross-sectional view taken along the line V-V' of FIG. 4A.

Referring to FIGS. 3 to 5, the adhesive layer 150 and the polarizer 160 are disposed below the substrate 110 and the insulating layer IN is disposed on the substrate 110. The plurality of high potential power line VDD, the plurality of data lines DL, the plurality of reference lines RL, and the light shielding layer LS are disposed on the insulating layer IN.

The plurality of high potential power lines VDD, the plurality of data lines DL, the plurality of reference lines RL, and the light shielding layer LS are disposed on the same layer of the substrate 110 and formed of the same conductive material. For example, the plurality of high potential power lines VDD, the plurality of data lines DL, the plurality of reference lines RL, and the light shielding layer LS may be configured by a conductive material, such as copper (Cu), aluminum (Al), molybdenum (Mo), nickel (Ni), titanium (Ti), chrome (Cr), or an alloy thereof, but are not limited thereto.

The plurality of high potential power lines VDD are wiring lines which transmit the high potential power signal to each of the plurality of sub pixels SP. The plurality of high potential power lines VDD extends between the plurality of sub pixels SP in a column direction and two sub pixels SP which are adjacent to each other in the row direction may share one high potential power line VDD among the plurality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG.

The plurality of data lines DL is lines which extend between the plurality of sub pixels SP in a column direction to transmit a data voltage to each of the plurality of sub pixels SP and includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the column direction to transmit a reference voltage to each of the plurality of sub pixels SP. The plurality of sub pixels SP which forms one pixel may share one reference line RL. For example, one reference line RL is disposed between the white sub pixel SPW and the blue sub pixel SPB to transmit a reference voltage to a third transistor TR3 of each of the red sub pixel SPR, the white sub pixel SPW, the blue sub pixel SPB, and the green sub pixel SPG.

Referring to FIGS. 4A and 5, the light shielding layer LS is disposed on the insulating layer IN. The light shielding layer LS is disposed so as to overlap the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material such as copper (Cu), aluminum (Al), molybdenum (Mo), nickel (Ni), titanium (Ti), chrome (Cr), or an alloy thereof is disposed so as to overlap the first active layer ACT1, light incident from the lower portion of the substrate 110 onto the first active layer ACT1 may be blocked. Accordingly, the reliability of the first transistor TR1 may be improved. However, it is not limited thereto and the light shielding layer LS may be disposed so as to overlap the second active layer ACT2 of the second transistor TR2 and the third active layer ACTS of the third transistor TR3.

In the meantime, even though in the drawing, it is illustrated that the light single layer LS is a single layer, the light shielding layer LS may be formed as a plurality of layers. For example, the light shielding layer LS may be formed of a plurality of layers disposed so as to overlap each other with at least one of the insulating layer IN, the buffer layer 111, the gate insulating layer 112, and the passivation layer 113 therebetween.

The buffer layer 111 is disposed on the plurality of high potential power lines VDD, the plurality of data lines DL, the plurality of reference lines RL, and the light shielding layer LS. The buffer layer 111 may reduce permeation of moisture or impurities through the substrate 110. For example, the buffer layer 111 may be configured by a single layer or a double layer of silicon oxide SiOx or silicon nitride SiNx, but is not limited thereto. Further, the buffer layer 111 may be omitted depending on a type of substrate 110 or a type of transistor, but is not limited thereto.

In each of the plurality of sub pixels SP, the first transistor TR1, the second transistor TR2, the third transistor TR3, and the storage capacitor SC are disposed on the buffer layer 111.

First, the first transistor TR1 includes a first active layer ACT1, a first gate electrode GE1, a first source electrode SE1, and a first drain electrode DE1.

The first active layer ACT1 is disposed on the buffer layer 111. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 112 is disposed on the first active layer ACT1. The gate insulating layer 112 is a layer for electrically insulating the first gate electrode GE1 from the first active layer ACT1 and may be formed of an insulating material. For example, the gate insulating layer 112 may be configured by a single layer or a double layer of silicon oxide SiOx or silicon nitride SiNx, but is not limited thereto.

The first gate electrode GE1 is disposed on the gate insulating layer 112 so as to overlap the first active layer ACT1. The first gate electrode GE1 may be configured by a conductive material such as copper (Cu), aluminum (Al), molybdenum (Mo), nickel (Ni), titanium (Ti), chrome (Cr), or an alloy thereof, but is not limited thereto.

A first source electrode SE1 and a first drain electrode DE1 which are spaced apart from each other are disposed on the gate insulating layer 112. The first source electrode SE1 and the first drain electrode DE1 may be electrically connected to the first active layer ACT1 through a contact hole formed on the gate insulating layer 112. The first source electrode SE1 and the first drain electrode DE1 may be disposed on the same layer as the first gate electrode GE1 to be formed of the same conductive material, but is not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPR.

At this time, an auxiliary high potential power line VDDa may be further disposed to electrically connect the first drain electrode DE1 with the high potential power line VDD. One end of the auxiliary high potential power line VDDa is electrically connected to the high potential power line VDD and the other end is electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 112 and the buffer layer 111. The other end of the auxiliary high potential power line VDDa extends to the first drain electrode DE1 to be integrally formed with the first drain electrode DE1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may be electrically connected by another method, but it is not limited thereto.

The first source electrode SE1 may be electrically connected to the light shielding layer LS through a contact hole formed on the gate insulating layer 112 and the buffer layer 111. Further, a part of the first active layer ACT1 connected to the first source electrode SE1 may be electrically connected to the light shielding layer LS through a contact hole formed on the buffer layer 111. If the light shielding layer LS is floated, a threshold voltage of the first transistor TR1 varies to affect the driving of the display device 100. Accordingly, the light shielding layer LS is electrically connected to the first source electrode SE1 to apply a voltage to the light shielding layer LS and it does not affect the driving of the first transistor TR1. However, in the present specification, even though it has been described that both the first active layer ACT1 and the first source electrode SE1 are in contact with the light shielding layer LS, only any one of the first source electrode SE1 and the first active layer ACT1 is in direct contact with the light shielding layer. It is not limited thereto.

In the meantime, even though in FIG. 5, it is illustrated that the gate insulating layer 112 is formed on the entire substrate 110, the gate insulating layer 112 may be patterned so as to overlap only the first gate electrode GE1, the first source electrode SE1, and the first drain electrode DE1, but is not limited thereto.

The second transistor TR2 includes a second active layer ACT2, a second gate electrode GE2, a second source electrode SE2, and a second drain electrode DE2.

The second active layer ACT2 is disposed on the buffer layer 111. The second active layer ACT2 may be formed of a semiconductor material such as an oxide semiconductor, amorphous silicon, or polysilicon, but is not limited thereto. For example, when the second active layer ACT2 is formed of an oxide semiconductor, the second active layer ACT2 may be formed by a channel region, a source region, and a drain region and the source region and the drain region may be conductive regions, but are not limited thereto.

The second source electrode SE2 is disposed on the buffer layer 111. The second source electrode SE2 may be integrally formed with the second active layer ACT2 to be electrically connected to each other. For example, the semiconductor material is formed on the buffer layer 111 and a part of the semiconductor material is made conductive to form the second source electrode SE2. Therefore, a part of the semiconductor material which is not made conductive may become a second active layer ACT2 and a conductive part of the semiconductor material becomes a second source electrode SE2. However, the second active layer ACT2 and the second source electrode SE2 may be separately formed, but it is not limited thereto.

The second source electrode SE2 is electrically connected to the first gate electrode GE1 of the first transistor TR1. The first gate electrode GE1 may be electrically connected to the second source electrode SE2 through a contact hole formed on the gate insulating layer 112. Accordingly, the first transistor TR1 may be turned on or turned off by a signal from the second transistor TR2.

The gate insulating layer 112 is disposed on the second active layer ACT2 and the second source electrode SE2 and the second drain electrode DE2 and the second gate electrode GE2 are disposed on the gate insulating layer 112.

The second gate electrode GE2 is disposed on the gate insulating layer 112 so as to overlap the second active layer ACT2. The second gate electrode GE2 may be electrically connected to the gate line GL and the second transistor TR2 may be turned on or turned off based on the gate voltage transmitted to the second gate electrode GE2. The second gate electrode GE2 may be configured by a conductive material such as copper (Cu), aluminum (Al), molybdenum (Mo), nickel (Ni), titanium (Ti), chrome (Cr), or an alloy thereof, but is not limited thereto.

In the meantime, the second gate electrode GE2 extends from the gate line GL. That is, the second gate electrode GE2 is integrally formed with the gate line GL and the second gate electrode GE2 and the gate line GL may be formed of the same material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area of the plurality of sub pixels SP to extend in the row direction. The gate line GL extends in the row direction to intersect the plurality of high potential power lines VDD, the plurality of data lines DL, and the plurality of reference lines RL extending in the column direction.

The second drain electrode DE2 is disposed on the gate insulating layer 112. The second drain electrode DE2 is electrically connected to the second active layer ACT2 through a contact hole formed in the gate insulating layer 112 and is electrically connected to one of the plurality of data lines DL through a contact hole formed in the gate insulating layer 112 and the buffer layer 111, simultaneously. For example, the second drain electrode DE2 of the red sub pixel SPR is electrically connected to the first data line DL1 and the second drain electrode DE2 of the white sub pixel SPW is electrically connected to the second data line DL2. For example, the second drain electrode DE2 of the blue sub pixel SPB is electrically connected to the third data line DL3 and the second drain electrode DE2 of the green sub pixel SPG is electrically connected to the fourth data line DL4. The second drain electrode DE2 may be configured by a conductive material, such as copper (Cu), aluminum (Al), molybdenum (Mo), nickel (Ni), titanium (Ti), chrome (Cr), or an alloy thereof, but is not limited thereto.

The third transistor TR3 includes a third active layer ACT3, a third gate electrode GE3, a third source electrode SE3, and a third drain electrode DE3.

The third active layer ACT3 is disposed on the buffer layer 111. The third active layer ACT3 may be formed of a semiconductor material such as an oxide semiconductor, amorphous silicon, or polysilicon, but is not limited thereto. For example, when the third active layer ACT3 is formed of an oxide semiconductor, the third active layer ACT3 is formed by a channel region, a source region, and a drain region, and the source region and the drain region of the third active layer ACT3 may be conductive regions, but are not limited thereto.

The gate insulating layer 112 is disposed on the third active layer ACT3 and the third gate electrode GE3, the third source electrode SE3, and the third drain electrode DE3 are disposed on the gate insulating layer 112.

The third gate electrode GE3 is disposed on the gate insulating layer 112 so as to overlap the third active layer ACT3. The third gate electrode GE3 is electrically connected to the sensing line SL and the third transistor TR3 may be turned on or turned off based on the sensing voltage transmitted to the third transistor TR3. The third gate electrode GE3 may be configured by a conductive material such as copper (Cu), aluminum (Al), molybdenum (Mo), nickel (Ni), titanium (Ti), chrome (Cr), or an alloy thereof, but is not limited thereto.

In the meantime, the third gate electrode GE3 extends from the sensing line SL. That is, the third gate electrode GE3 is integrally formed with the sensing line SL and the third gate electrode GE3 and the sensing line SL may be formed of the same material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The third source electrode SE3 may be electrically connected to the third active layer ACTS through a contact hole formed on the gate insulating layer 112. The third source electrode SE3 may be configured by a conductive material such as copper (Cu), aluminum (Al), molybdenum (Mo), nickel (Ni), titanium (Ti), chrome (Cr), or an alloy thereof, but is not limited thereto.

Further, a part of the third active layer ACT3 which is in contact with the third source electrode SE3 may be electrically connected to the light shielding layer LS through a contact hole formed in the buffer layer 111. That is, the third source electrode SE3 may be electrically connected to the light shielding layer LS with the third active layer ACT3 therebetween. Therefore, the third source electrode SE3 and the first source electrode SE1 may be electrically connected to each other through the light shielding layer LS.

The third drain electrode DE3 may be electrically connected to the third active layer ACT3 through a contact hole formed on the gate insulating layer 112. The third drain electrode DE3 may be configured by a conductive material such as copper (Cu), aluminum (Al), molybdenum (Mo), nickel (Ni), titanium (Ti), chrome (Cr), or an alloy thereof, but is not limited thereto.

The third drain electrode DE3 is electrically connected to the reference line RL. For example, the third drain electrodes DE3 of the red sub pixel SPR, the white sub pixel SPW, the blue sub pixel SPB, and the green sub pixel SPG which form one pixel may be electrically connected to the same reference line RL. That is, the plurality of sub pixels SP which forms one pixel may share one reference line RL.

At this time, an auxiliary reference line RLa may be disposed to transmit the reference line RL extending in the column direction to the plurality of sub pixels SP which is disposed in parallel along the row direction. The auxiliary reference line RLa extends in the row direction to electrically connect the reference line RL and the third drain electrode DE3 of each of the plurality of sub pixels SP. One end of the auxiliary reference line RLa is electrically connected to the reference line RL through a contact hole formed in the buffer layer 111 and the gate insulating layer 112. The other end of the auxiliary reference line RLa is electrically connected to the third drain electrode DE3 of each of the plurality of sub pixels SP. In this case, the auxiliary reference line RLa is integrally formed with the third drain electrode DE3 of each of the plurality of sub pixels SP and a reference voltage from the reference line RL is transmitted to the third drain electrode DE3 by means of the auxiliary reference line RLa. However, the auxiliary reference line RLa may be separately formed from the third drain electrode DE3, but is not limited thereto.

The storage capacitor SC is disposed in the circuit area CA of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC includes a first capacitor electrode SC1 and a second capacitor electrode SC2.

First, in each of the plurality of sub pixels SP, the first capacitor electrode SC1 is disposed between the insulating layer IN and the buffer layer 111. The first capacitor electrode SC1 may be disposed to be the closest to the substrate 110 among the conductive components disposed on the substrate 110. The first capacitor electrode SC1 is integrally formed with the light shielding layer LS and is electrically connected to the first source electrode SE1 by means of the light shielding layer LS.

The buffer layer 111 is disposed on the first capacitor electrode SC1, and the second capacitor electrode SC2 is disposed on the buffer layer 111. The second capacitor electrode SC2 may be disposed so as to overlap the first capacitor electrode SC1. The second capacitor electrode SC2 is integrally formed with the second source electrode SE2 to be electrically connected to the second source electrode SE2 and the first gate electrode GE1. For example, the semiconductor material is formed on the buffer layer 111 and a part of the semiconductor material is made conductive to form the second source electrode SE2 and the second capacitor electrode SC2. Accordingly, a part of the semiconductor material which is not made conductive functions as a second active layer ACT2 and the part of the semiconductor material that is made conductive functions as a second source electrode SE2 and the second capacitor electrode SC2. As described above, the first gate electrode GE1 is electrically connected to the second source electrode SE2 through the contact hole formed in the gate insulating layer 112. Accordingly, the second capacitor electrode SC2 is integrally formed with the second source electrode SE2 to be electrically connected to the second source electrode SE2 and the first gate electrode GE1.

In summary, the first capacitor electrode SC1 of the storage capacitor SC is integrally formed with the light shielding layer LS to be electrically connected to the light shielding layer LS, the first source electrode SE1, and the third source electrode SE3. Accordingly, the second capacitor electrode SC2 is integrally formed with the second source electrode SE2 and the active layer ACT2 to be electrically connected to the second source electrode SE2 and the first gate electrode GE1. Accordingly, the first capacitor electrode SC1 and the second capacitor electrode SC2 which overlap with the buffer layer 111 therebetween constantly maintain the voltage of the first gate electrode GE1 and the first source electrode SE1 of the first transistor TR1 while the light emitting diode OLED emits light to maintain the constant state of the light emitting diode OLED.

The passivation layer 113 is disposed on the first transistor TR1, the second transistor TR2, the third transistor TR3, and the storage capacitor SC. The passivation layer 113 is an insulating layer for protecting components below the passivation layer 113. For example, the passivation layer 113 may be configured by a single layer or a double layer of silicon oxide SiOx or silicon nitride SiNx, but is not limited thereto. Further, the passivation layer 113 may be omitted depending on the exemplary embodiment.

A plurality of color filters CF may be disposed in the emission area EA of each of the plurality of sub pixels SP on the passivation layer 113. As described above, the display device 100 according to the exemplary embodiment of the present disclosure is a bottom emission type in which light emitted from the light emitting diode OLED is directed to the lower portion of the light emitting diode OLED and the substrate 110. Therefore, the plurality of color filters CF may be disposed below the light emitting diode OLED. Light emitted from the light emitting diode OLED passes through the plurality of color filters CF and implemented as various colors of light.

The plurality of color filters CF may include a red color filter CFR, a blue color filter CFB, and a green color filter CFG. The red color filter CFR is disposed in an emission area of a red sub pixel SPR of the plurality of sub pixels SP, the blue color filter CFB is disposed in an emission area of the blue sub pixel SPB, and the green color filter CFG is disposed in an emission area of the green sub pixel SPG.

The over coating layer 114 is disposed on the passivation layer 113 and the plurality of color filters CF. The over coating layer 114 is an insulating layer which planarizes an upper portion of the substrate 110 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The over coating layer 114 may be formed of an organic material, and for example, may be configured by a single layer or a double layer of polyimide or photo acryl, but is not limited thereto.

The light emitting diode OLED is disposed in an emission area of each of the plurality of sub pixels SP. The light emitting diode OLED is disposed on the over coating layer 114 in each of the plurality of sub pixels SP. The light emitting diode OLED includes an anode 121, an emission layer 122, and a cathode 123.

The anode 121 is disposed on the over coating layer 114 in the emission area EA. The anode 121 supplies holes to the emission layer 122 so that the anode 121 may be formed of a conductive material having a high work function. For example, the anode 121 may be formed of a transparent conductive material such as indium tin oxide (ITO) and indium zinc oxide (IZO), but is not limited thereto.

In the meantime, the anode 121 extends toward the circuit area CA. A part of the anode 121 extends toward the first source electrode SE1 of the circuit area CA from the emission area EA and is electrically connected to the first source electrode SE1 through a contact hole formed in the over coating layer 114 and the passivation layer 113. Accordingly, the anode 121 of the light emitting diode OLED extends to the circuit area CA to be electrically connected to the first source electrode SE1 of the first transistor TR1 and the second capacitor electrode SC2 of the storage capacitor SC.

In the emission area EA and the circuit area CA, the emission layer 122 is disposed on the anode 121. The emission layer EL may be formed as one layer over the plurality of sub pixels SP. That is, the emission layers EL of the plurality of sub pixels SP are connected to each other to be integrally formed. The emission layer 122 may be configured by one emission layer 122 or may have a structure in which a plurality of emission layers which emits different color light are laminated. The emission layer 122 may further include an organic layer such as a hole injection layer, a hole transport layer, an electron transport layer, and an electron injection layer.

In the emission area EA and the circuit area CA, the cathode 123 is disposed on the emission layer 122. The cathode 123 supplies electrons to the emission layer 122 so that the cathode 123 may be formed of a conductive material having a low work function. The cathode 123 may be formed as one layer over the plurality of sub pixels SP. That is, the cathodes 123 of the plurality of sub pixels SP are connected to be integrally formed. For example, the cathode 123 may be formed of a transparent conductive material such as indium tin oxide (ITO) and indium zinc oxide (IZO) or ytterbium (Yb) alloy and may further include a metal doping layer, but is not limited thereto. Even though it is not illustrated in FIGS. 4 and 5, the cathode 123 of the light emitting diode OLED is electrically connected to the low potential power line VSS (not shown) to be supplied with a low potential power voltage.

The bank 115 is disposed between the anode 121 and the emission layer 122. The bank 115 is disposed to overlap the active area AA and cover the edge of the anode 121. The bank 115 is disposed at the boundary between the sub pixels SP which are adjacent to each other to reduce the mixture of light emitted from the light emitting diode OLED of each of the plurality of sub pixels SP. The bank 115 may be formed of an insulating material such as, polyimide, acryl, or benzocyclobutene (BCB) resin, but it is not limited thereto.

In the display device 100 according to the exemplary embodiment of the present disclosure, the substrate 110 is formed of any one of a transparent conducting oxide and an oxide semiconductor to reduce a thickness of the display device 100. In the related art, the plastic substrate has been mainly used as the substrate of the display device. However, the plastic substrate is formed by coating and curing a substrate material at a high temperature so that there are problems in that it takes a long time and it is difficult to form the thickness to be lower than a predetermined level. In contrast, the transparent conducting oxide and the oxide semiconductor may be formed to have a very thin thickness by the deposition process such as sputtering. Therefore, in the display device 100 according to the exemplary embodiment of the present disclosure, a substrate 100 which supports various components of the display device 100 is configured by a transparent conducting oxide layer or the oxide semiconductor layer to reduce a thickness of the display device 100 and implement a slim design.

In the display device 100 according to the exemplary embodiment of the present disclosure, the substrate 110 is formed of a transparent conducting oxide or an oxide semiconductor to improve the flexibility of the display device 100 and reduce the stress generated when the display device 100 is deformed. Specifically, when the substrate 110 is configured by the transparent conducting oxide layer or the oxide semiconductor, the substrate 110 may be formed as a very thin film. In this case, the substrate 110 is also referred to as a first transparent thin film layer. Accordingly, the display device 100 including a substrate 110 may have a high flexibility and the display device 100 may be easily bent or rolled. Therefore, in the display device 100 according to the exemplary embodiment of the present disclosure, the substrate 110 is formed by any one of the transparent conducting oxide layer and the oxide semiconductor to improve the flexibility of the display device 100. Accordingly, the stress generated when the display device 100 is deformed is also relieved so that the crack caused in the display device 100 may be minimized.

Further, in the display device 100 according to the exemplary embodiment of the present disclosure, the substrate 110 is formed of any one of a transparent conducting oxide layer and an oxide semiconductor layer to reduce the possibility of generating the static electricity in the substrate 110. If the substrate 110 is formed of plastic so that the static electricity is generated, various wiring lines and driving elements on the substrate 110 are damaged or the driving is affected due to the static electricity to degrade the display quality. Instead, when the substrate 110 is formed of the transparent conducting oxide layer or the oxide semiconductor layer, the static electricity generated in the substrate 110 is minimized and a configuration for blocking and discharging the static electricity may be simplified. Accordingly, in the display device 100 according to the exemplary embodiment of the present disclosure, the substrate 110 is formed of any one of the transparent conducting oxide layer or the oxide semiconductor having a low possibility of generating the static electricity. By doing this, the damage or the display quality degradation due to the static electricity may be minimized.

Further, in the display device 100 according to the exemplary embodiment of the present disclosure, the substrate 110 is formed of one of the transparent conducting oxide and the oxide semiconductor to minimize the permeation of the moisture or oxygen of the outside into the display device 100 by means of the substrate 110. When the substrate 110 is formed of the transparent conducting oxide layer or the oxide semiconductor, the substrate 110 is formed in the vacuum environment so that the foreign material generation possibility is significantly low. Further, even though the foreign material is generated, the size of the foreign material is very small so that the permeation of the moisture and oxygen into the display device 100 may be minimized. Accordingly, in the display device 100 according to the exemplary embodiment of the present disclosure, the substrate 110 is formed of a transparent conducting oxide or the oxide semiconductor having a low possibility of generating the foreign materials and an excellent moisture permeation performance. By doing this, the reliability of the light emitting diode OLED including an organic layer and the display device 100 may be improved.

Various elements such as a plurality of wiring lines and transistors are disposed on the substrate. A voltage is applied thereto so that the current flows and various electric fields may be formed by the influence thereof. The substrate which is the transparent conducting oxide or the oxide semiconductor layer is affected by various electric fields so that electrons are gathered in a part of the substrate and the holes are gathered in the other part to form polarizations, that is, different electric fields. The electric fields formed on the substrate may affect characteristics of various configurations disposed on the substrate.

Therefore, in the display device 100 according to the exemplary embodiment of the present disclosure, the substrate 110 includes a plurality of substrate patterns 110P and the air gap H1 defined by the plurality of substrate patterns 110P, the insulating layer IN, and the adhesive layer 150 is disposed on the adhesive layer 150. Specifically, in the active area AA in which the plurality of sub pixels SP, the substrate pattern 110P is disposed in the emission area EA and the air gap H1 is disposed in the circuit area CA. Therefore, the parasitic capacitance formed between the plurality of thin film transistors TR1, TR2, TR3, the storage capacitor and various wiring lines and the substrate may be minimized.

In the display device 100 according to the exemplary embodiment of the present disclosure, the substrate 110 is formed of any one of a transparent conducting oxide and an oxide semiconductor to perform a LLO process. The sacrificial layer may use a hydrogenated amorphous silicon or an amorphous silicon which is hydrogenated and doped with impurities. After completing the manufacturing of the display device 100, when a laser is irradiated from the lower portion of the temporary substrate, the hydrogen of the sacrificial layer is dehydrogenated and the sacrificial layer and the temporary substrate may be separated from the substrate 110. At this time, the transparent conducting oxide and the oxide semiconductor are materials which may perform the LLO process with the sacrificial layer and the temporary substrate. Therefore, even though the substrate 110 is formed of any one of the transparent conducting oxide or the oxide semiconductor, the substrate 110 may be easily separated from the temporary substrate.

The LLO process of the active area AA will be more specifically described with reference to FIGS. 6A to 6C.

Figure 6A:
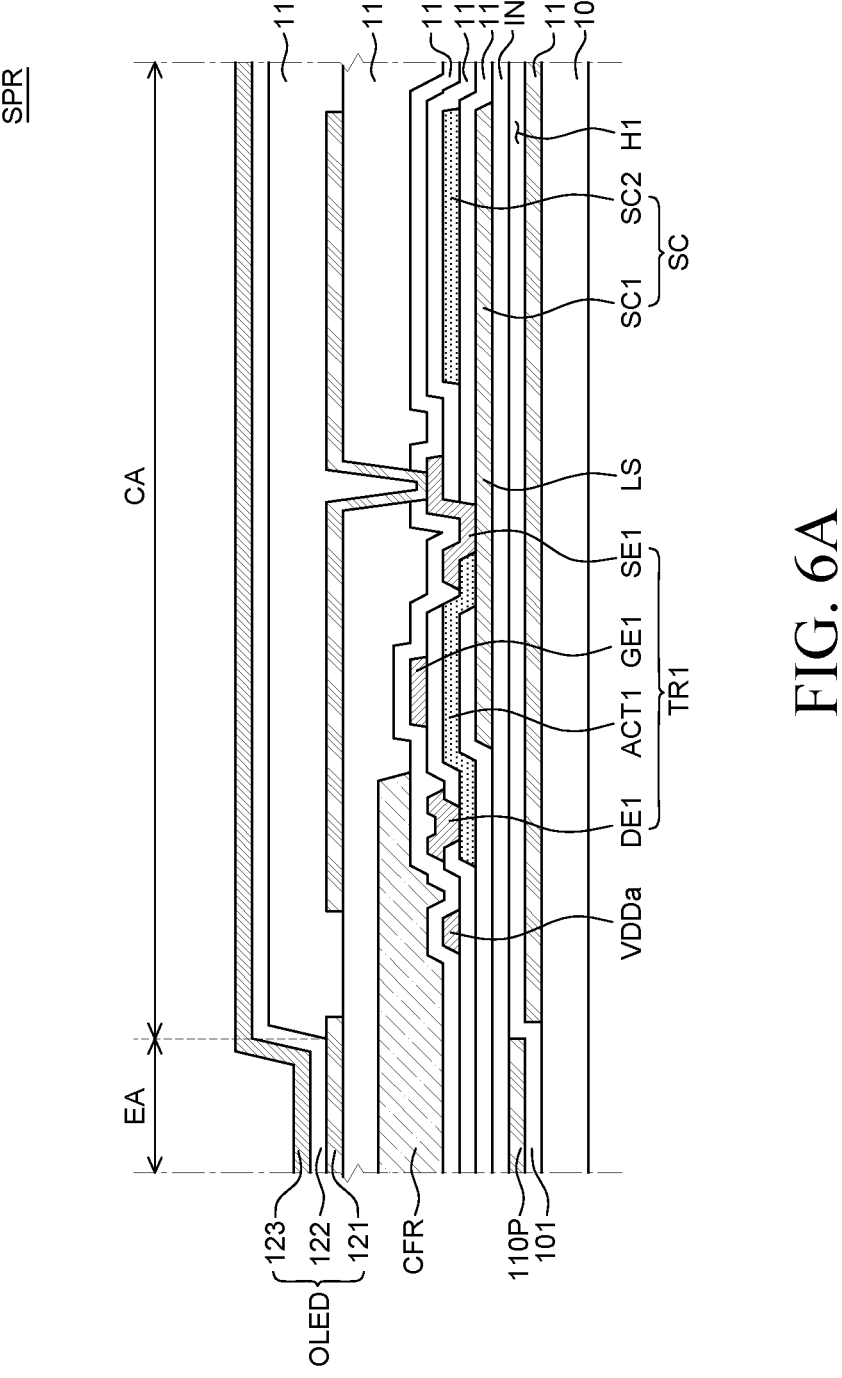
FIGS. 6A to 6C are cross-sectional views schematically illustrating a manufacturing method of a display device according to an exemplary embodiment of the present disclosure.
Figure 6B:
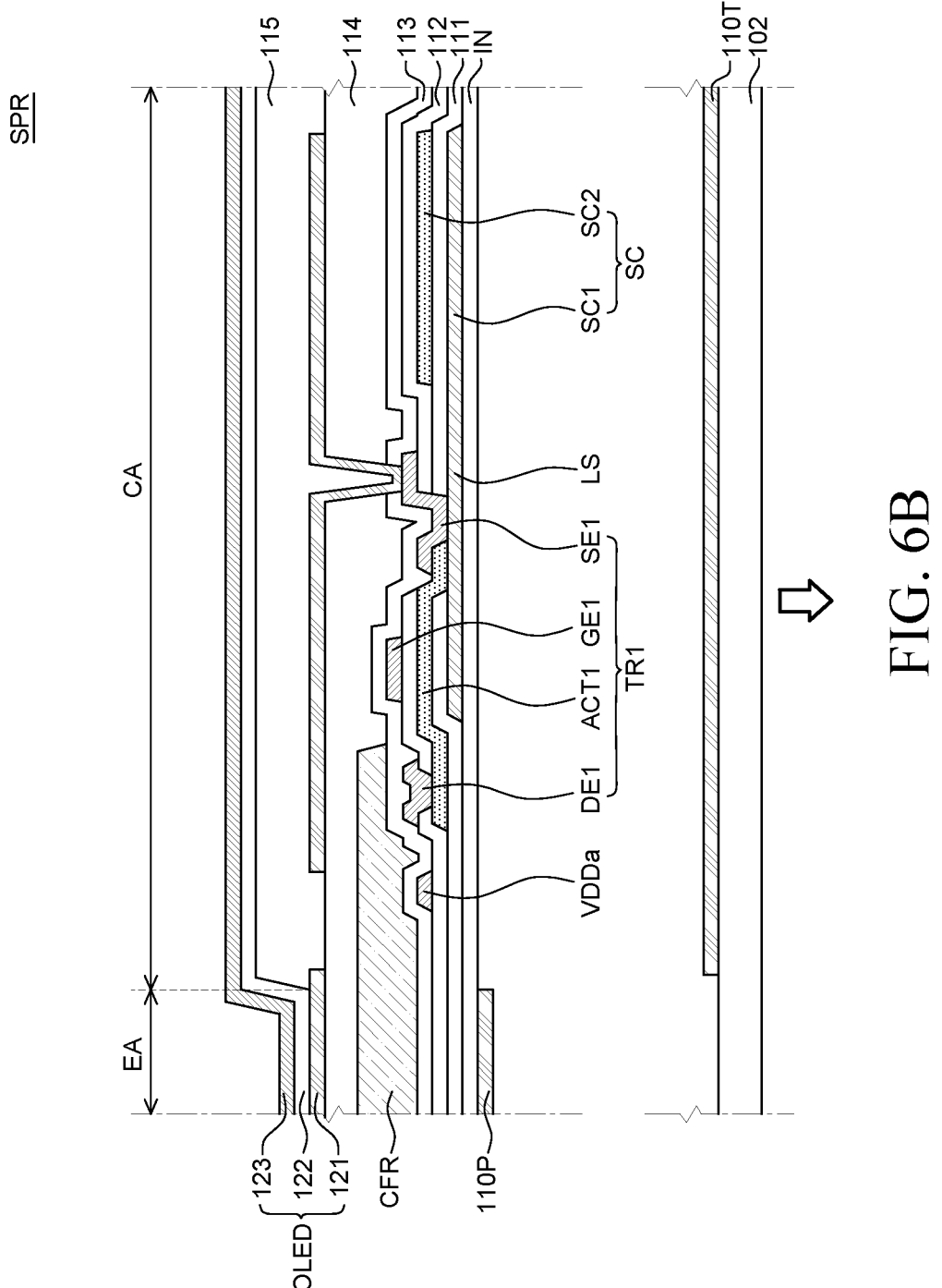
Figure 6C:
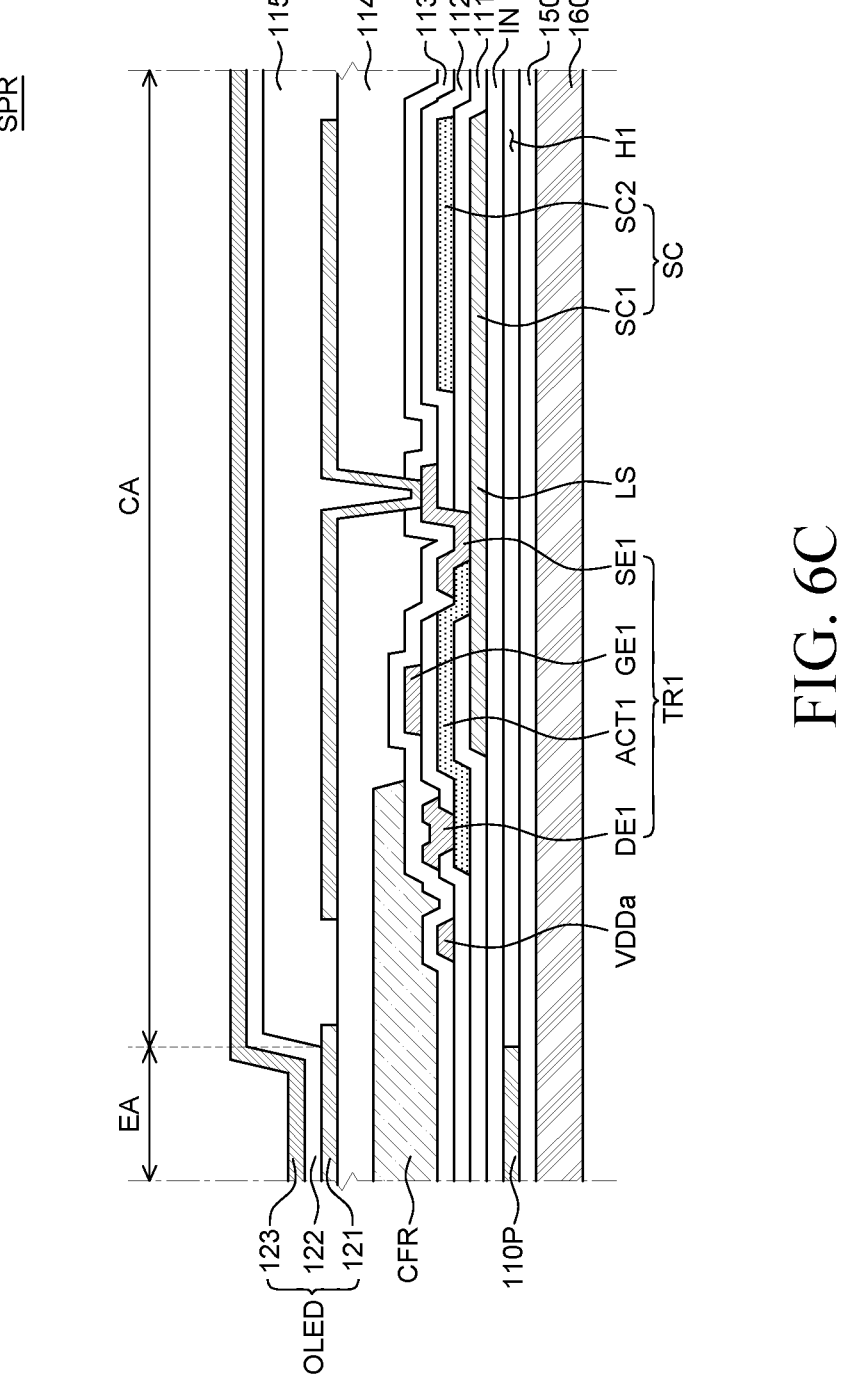

FIGS. 6A to 6C are cross-sectional views schematically illustrating a manufacturing method of a display device according to an exemplary embodiment of the present disclosure. The display device 100 of FIG. 6C has the substantially same configuration as the display device 100 of FIG. 5 so that a redundant description will be omitted.

First, referring to FIG. 6A, after forming a temporary pattern 110T in an area of a temporary substrate 102 corresponding to the circuit area CA, a sacrificial layer 101 is formed above the temporary substrate 102 and the temporary pattern 110T. Thereafter, a substrate pattern 110P is formed in an area of the temporary substrate 102 corresponding to the emission area EA. Therefore, the sacrificial layer 101 is disposed below the substrate pattern 110P in the emission area EA and the sacrificial layer 101 is disposed above the temporary pattern 110T in the circuit area CA. After forming the substrate pattern 110P, a process of sequentially forming components from the insulating layer IN is performed.

Next, referring to FIG. 6B, the LLO process is performed to separate the temporary substrate 102 and the temporary pattern 110T from the substrate pattern 110P. The sacrificial layer 101 is decomposed by the laser during the LLO process, the temporary substrate 102 and the temporary pattern 110T may be detached in an arrow illustrated in FIG. 6B.

Next, referring to FIG. 6C, the adhesive layer 150 is disposed on lower surfaces of the substrate pattern 110P and the insulating layer IN. Therefore, in the circuit area CA, the air gap H1 enclosed by the substrate pattern 110P may be formed between the insulating layer IN and the adhesive layer 150. That is, it means that the inorganic insulating layer is disposed on the plurality of substrate patterns 110P and the air gap H1. Further, the polarizer 160 which suppresses the reflection of the external light or a barrier film which suppresses the permeation of the foreign material may be disposed on a lower surface of the adhesive layer 150.

A plurality of substrate patterns are disposed above the sacrificial layer so as to correspond to the emission area. However, in the circuit area, when the temporary substrate, the sacrificial layer, and the insulating layer are disposed in this order without disposing the plurality of substrate patterns, the sacrificial layer and the insulating layer are disposed to be in contact with each other. During the LLO process, in the emission area, the sacrificial layer is separated from the plurality of substrate pattern. However, in the circuit area, both the insulating layer and the sacrificial layer are formed of a silicon based material so that the tearing defect of the insulating layer is caused due to the strong bonding capacity between the insulating layer and the sacrificial layer. Therefore, in order to remove the strong bonding capacity, a laser with a higher energy needs to be irradiated so that the emission layer of the light emitting diode may be damaged.

Accordingly, in the display device 100 according to the exemplary embodiment of the present disclosure, in order to suppress the tearing defect of the insulating layer IN which may be caused during the LLO process, in the circuit area CA, the temporary pattern 110T is disposed between the sacrificial layer 101 and the temporary substrate 102. Accordingly, the temporary pattern 110T is disposed on the temporary substrate 102, the sacrificial layer 101 is disposed on the temporary pattern 110T, and the insulating layer IN is disposed on the sacrificial layer 101. Therefore, during the LLO process, the sacrificial layer 101 is separated from the substrate pattern 110P or the temporary pattern 110T in both the emission area EA and the circuit area CA, respectively, and the temporary pattern 110T is disposed below the sacrificial layer 101 in the circuit area CA. Accordingly, in the display device 100 according to the exemplary embodiment of the present disclosure, the LLO process may be easily performed even with a laser having a low energy, without causing the tearing defect of the insulating layer IN in the circuit area CA.

Next, an area of the non-active area NA in which the gate driver GD is disposed will be described in more detail with reference to FIGS. 7 to 8B together.

Figure 7:
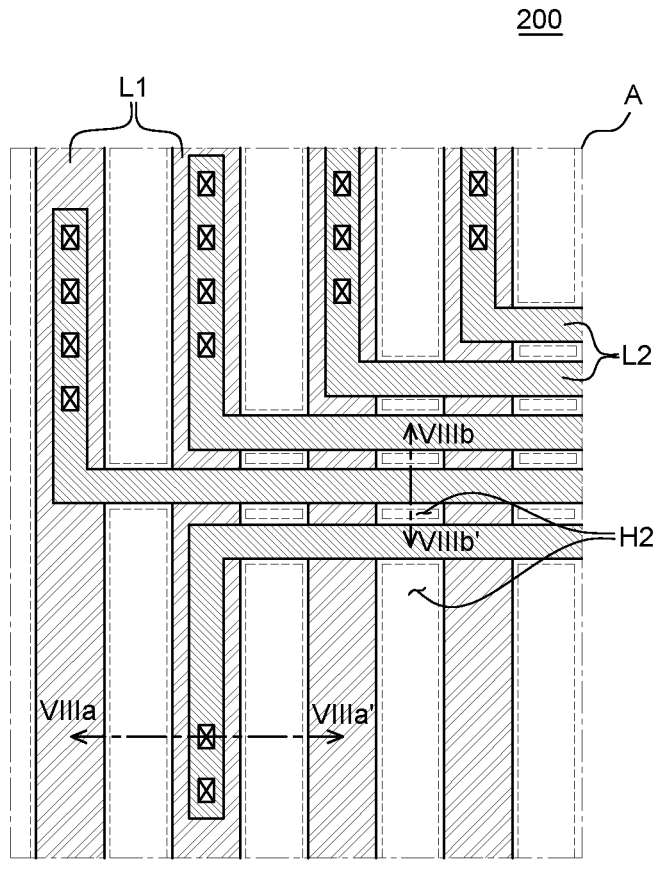
FIG. 7 is an enlarged plan view of a display device according to another exemplary embodiment of the present disclosure.
Figure 8A:
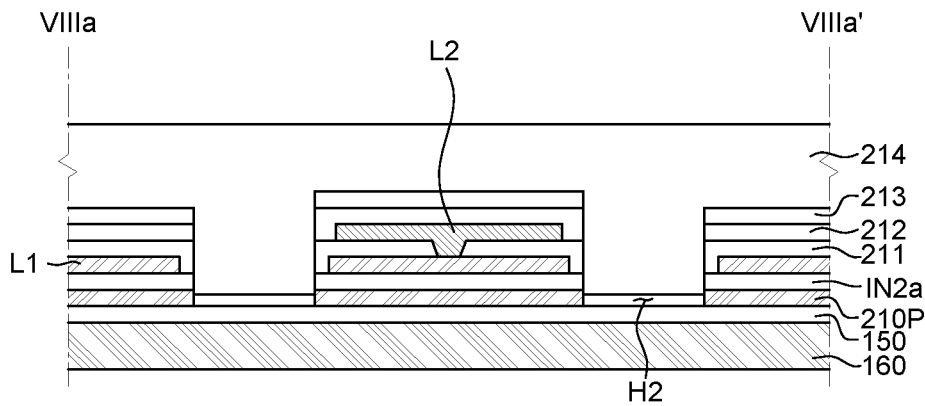
FIG. 8A is a cross-sectional view taken along the line VIIIa-VIIIa' of FIG. 7.

FIG. 7 is an enlarged plan view of a display device according to another exemplary embodiment of the present disclosure. FIG. 8A is a cross-sectional view taken along the line VIIIa-VIIIa' of FIG. 7. FIG. 8B is a cross-sectional view taken along the line VIIIb-VIIIb' of FIG. 7. FIG. 7 is an enlarged plan view of a partial area of a gate driver GD in a non-active area NA of a display device 200 according to another exemplary embodiment of the present disclosure, and for example, an enlarged plan view corresponding to an area A of FIG. 1. In FIG. 7, for the convenience of description, with regard to the substrate, only an air gap H2 excluding a plurality of substrate patterns 210P is illustrated. Referring to FIGS. 7, 8A, and 8B, the display device 200 according to another exemplary embodiment of the present disclosure includes a plurality of substrate patterns 210P, an insulating pattern IN2*a*, a buffer pattern 211, a gate insulating pattern 212, a passivation pattern 213, an over coating layer 214, an adhesive layer 150, a polarizer 160, a first wiring line L1, and a second wiring line L2.

The non-active area NA includes a gate driving area. The gate driving area is an area where a gate driver GD is disposed. For example, the gate driving area in which the gate driver GD is formed may be a non-active area at a left side and a right side of the active area AA, but is not limited thereto. In this case, the gate driving area in which the gate driver GD is disposed may also be referred to as a GIP area.

The gate driver GD is disposed in the gate driving area of the non-active area NA. The gate driver GD outputs a gate voltage and an emission control voltage in accordance with the control of the timing controller to select a sub pixel SP to which the data voltage is charged and control an emission timing. The gate driver GD may be formed in the non-active area NA of the substrate 110 in the gate-driver in panel (GIP) manner.

Even though it is not illustrated in the drawing, the gate driver GD includes a shift register and a signal line unit. The shift register is configured by a plurality of stages including a plurality of control switches which receives a clock signal to output a scan pulse, that is, a gate voltage, to a gate line GL located in the active area AA. The plurality of stages may be electrically connected to the gate lines GL.

In the non-active area NA, the plurality of wiring lines L1 is disposed on the plurality of substrate patterns 210P. The plurality of first wiring lines L1 may be routing lines which are disposed in the gate driver GD and transmit signals to the shift register. For example, the plurality of first wiring lines L1 may be a power line and a clock line.

Referring to FIGS. 5 and 8A together, it is illustrated that the plurality of first wiring lines L1 is disposed on the same layer as the light shielding layer LS and formed of the same material as the light shielding layer LS. However, the plurality of first wiring lines L1 may be formed of the same material on the same layer as any one selected from the gate electrodes GE1, GE2, GE3, the source electrodes SE1, SE2, SE3, the drain electrodes DE1, DE2, DE3, and the light shielding layer LS.

Figure 8B:
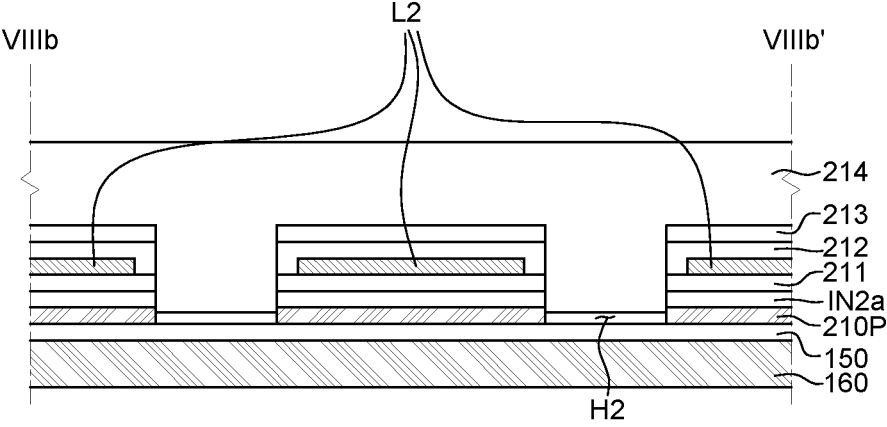
FIG. 8B is a cross-sectional view taken along the line VIIIb-VIIIb' of FIG. 7.

Referring to FIGS. 8A and 8B, a plurality of insulating patterns IN2a are disposed between the plurality of substrate patterns 210P and the plurality of first wiring lines L1. That is, the plurality of substrate patterns 210P may be disposed so as to overlap the plurality of first wiring lines L1 and the insulating layer includes a plurality of insulating patterns IN2a. In the gate driver GD, the plurality of substrate patterns 210P, the plurality of insulating patterns IN2a on the plurality of substrate patterns 210P, and the plurality of first wiring lines L1 on the plurality of substrate patterns 210P may be disposed. At this time, widths of the plurality of insulating patterns IN2a may be equal to those of the plurality of substrate patterns 210P, but are not limited thereto.

In the non-active area NA, the plurality of second wiring lines L2 are disposed on the plurality of first wiring lines L1. The plurality of second wiring lines L2 are wiring lines which are electrically connected to the plurality of first wiring lines L1 and are routing lines which transmit signals to the shift register. All the plurality of first wiring lines L1 and the plurality of second wiring lines L2 have the same purpose for transmitting signals. The plurality of first wiring lines L1 are defined as wiring lines extending in a first direction in which the data line DL extends and the plurality of second wiring lines L2 are defined as wiring lines extending in a second direction in which the gate line GL extends to intersect the first direction.

Referring to FIGS. 5, 8A, and 8B, even though it is illustrated that the plurality of second wiring lines L2 are disposed on the same layer as the gate line GL and are formed of the same material as the gate line GL, the plurality of second wiring lines L2 may be formed of the same material on the same layer as the source electrode SE1 or the drain electrode DE1.

The plurality of buffer patterns 211 may be disposed between the plurality of first wiring lines L1 and the plurality of second wiring lines L2. That is, the buffer layer includes the plurality of buffer patterns 211. The plurality of second wiring lines L2 may be electrically connected to the plurality of first wiring lines L1 by means of a contact hole disposed in the plurality of buffer patterns 211. At this time, widths of the plurality of buffer patterns 211 may be equal to those of the plurality of substrate patterns 210P, but are not limited thereto.

A plurality of gate insulating patterns 212 are disposed on the plurality of second wiring lines L2 and a plurality of passivation patterns 213 are disposed on the plurality of gate insulating patterns 212. That is, the gate insulating layer includes the plurality of gate insulating patterns 212 and the passivation layer includes the plurality of passivation patterns 213. At this time, widths of the plurality of gate insulating patterns 212 and widths of the plurality of passivation patterns 213 may be equal to those of the plurality of substrate patterns 210P, but are not limited thereto.

The over coating layer 214 is disposed between the plurality of insulating patterns IN2a and on the insulating layer 150, and the over coating layer 214 is spaced apart from the adhesive layer 150. The over coating layer 214 is disposed on the passivation pattern 213, between the plurality of patterns 210P, between the plurality of insulating patterns IN2a, between the plurality of first wiring lines L1, between the plurality of buffer patterns 211, between the plurality of second wiring lines L2, between the plurality of gate insulating patterns 212, and between the plurality of passivation patterns 213. However, the over coating layer 214 is not filled in the entire space disposed in an area between the plurality of substrate patterns 210P, but filled only in a part of a side surface adjacent to an upper surface of the plurality of substrate patterns 210P. Accordingly, the over coating layer 124 is spaced apart from the adhesive layer 150 to form the air gap H2.

A lower surface of the over coating layer 214 is spaced apart from the adhesive layer 150 and is in contact with side surfaces of the plurality of substrate patterns 210P. In other words, the over coating layer 214 is filled in a space disposed in an area between the plurality of substrate patterns 210P, but is filled so as to be in contact with only a part of the side surface adjacent to the upper surface of the plurality of substrate patterns 210P. Therefore, the over coating layer is spaced apart from the adhesive layer 150 to form the air gap H2. Therefore, the air gap H2 may be defined by the adhesive layer 150, the over coating layer 214, and the plurality of substrate patterns 210P. That is, unlike the active area AA in which the inorganic insulating layer is disposed on the air gap H1, the over coating layer 214 which is an organic insulating layer may be disposed on the air gap H2 of the non-active area NA.

The gate driving area of the non-active area is an area which extends in a winding or unwinding direction when the display device is wound or unwound so that when the insulating layer or the connection line is cracked, the crack is more likely to be propagated.

Therefore, in the display device 200 according to another exemplary embodiment of the present disclosure, in the non-active area NA in which the gate driver GD is disposed, the plurality of substrate patterns 210P are disposed in an area overlapping the first wiring line L1 or the second wiring line L2 and the air gap H2 is disposed in the remaining area. As a result, cracks of the inorganic insulating layer or the wiring line due to the shear stress caused by the deformation of the polarizer 160 or the barrier film or the propagation of the crack may be minimized. That is, the air gap H2 disperses or blocks the shear stress caused by the deformation of the polarizer 160 or the barrier film so that the propagation of the crack may be not only stopped, but also suppressed.

Hereinafter, the LLO process of the non-active area NA in which the gate driver GD is disposed will be described in more detail with reference to FIGS. 9A to 9E together.

FIGS. 9A to 9F are cross-sectional views schematically illustrating a manufacturing method of a display device according to another exemplary embodiment of the present disclosure.

Figure 9A:
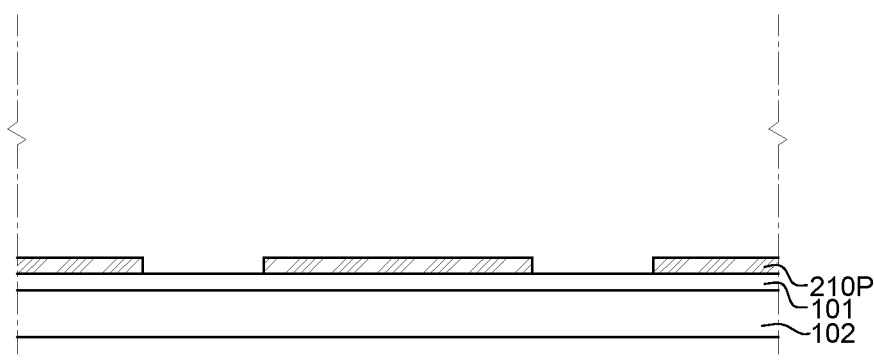
FIGS. 9A to 9F are cross-sectional views schematically illustrating a manufacturing method of a display device according to another exemplary embodiment of the present disclosure.

First, referring to FIG. 9A, the sacrificial layer 101 is formed above the temporary substrate 102 and then the substrate pattern 210P is formed in an area of the temporary substrate 102 corresponding to the first wiring line L1 or the second wiring line L2. That is, the substrate pattern 210P has a width larger than an area in which the first wiring line L1 and the second wiring line L2 are disposed.

Figure 9B:
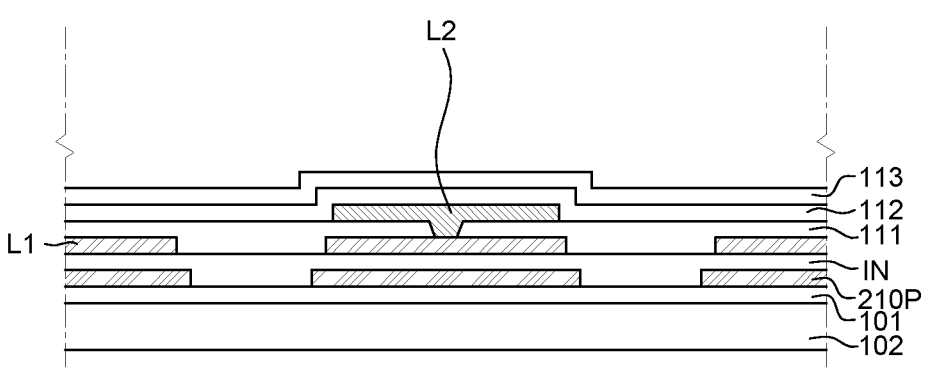

Next, referring to FIG. 9B, the insulating layer IN is disposed above the substrate pattern 210P, and the first wiring line L1, the buffer layer 111, the second wiring line L2, the gate insulating layer 112, and the passivation layer 113 are sequentially disposed above the insulating layer IN.

Figure 9C:
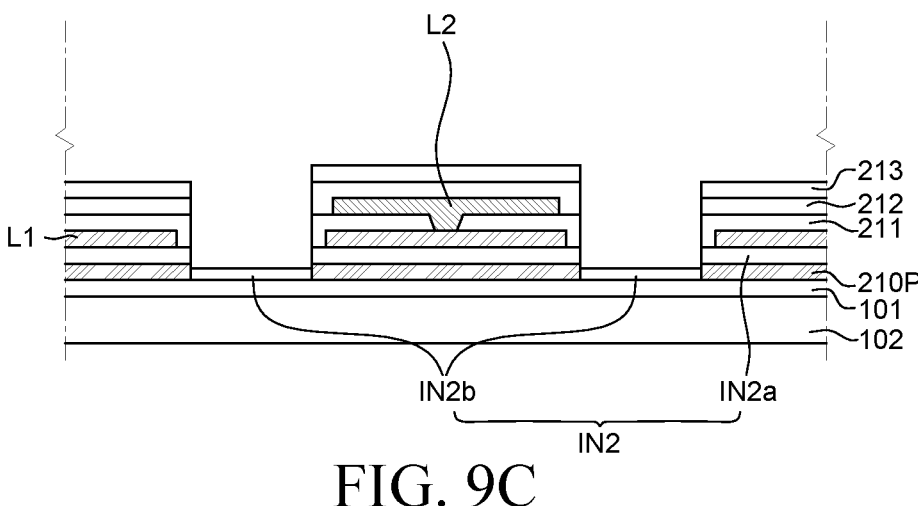

Next, referring to FIG. 9C, the insulating layer, the buffer layer, the gate insulating layer, and the passivation layer which overlap an area between the different adjacent substrate patterns 210P are etched to form the insulating pattern IN2, the buffer pattern 211, the gate insulating pattern 212, and the passivation pattern 213. At this time, a part of the insulating layer which is in contact with side surfaces of the sacrificial layer 101 and the substrate pattern 210P is not etched and as a result a temporary insulating pattern IN2b having a thickness smaller than a thickness of the substrate pattern 210P may be formed. Accordingly, the insulating pattern IN2 may be divided into an insulating pattern IN2a disposed above the substrate pattern 210P and a temporary insulating pattern IN2b disposed between the plurality of substrate patterns 210P. Further, holes are disposed in the etched areas of the insulating layer, the buffer layer, the gate insulating layer, and the passivation layer. The insulating pattern IN2a, the buffer pattern 211, the gate insulating pattern 212, and the passivation pattern 213 which are disposed on the plurality of substrate patterns 210P may have the same width as the substrate pattern 210P.

Figure 9D:
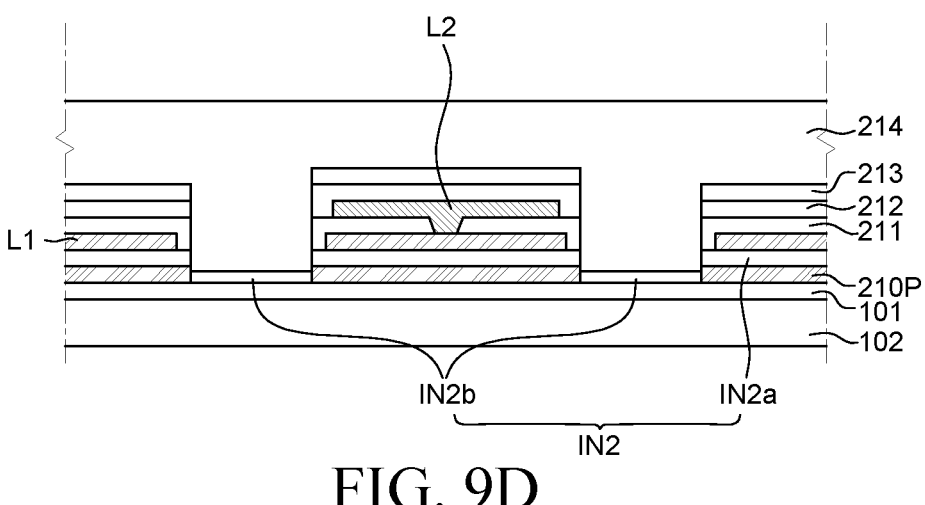

Next, referring to FIG. 9D, the over coating layer 214 which is filled in the hole may be formed above the plurality of passivation patterns 213. The over coating layer 214 is fully filled in the holes to be in contact with an upper portion of the temporary insulating patterns IN2b disposed between the plurality of substrate patterns 210P.

Figures 9E, 9F:
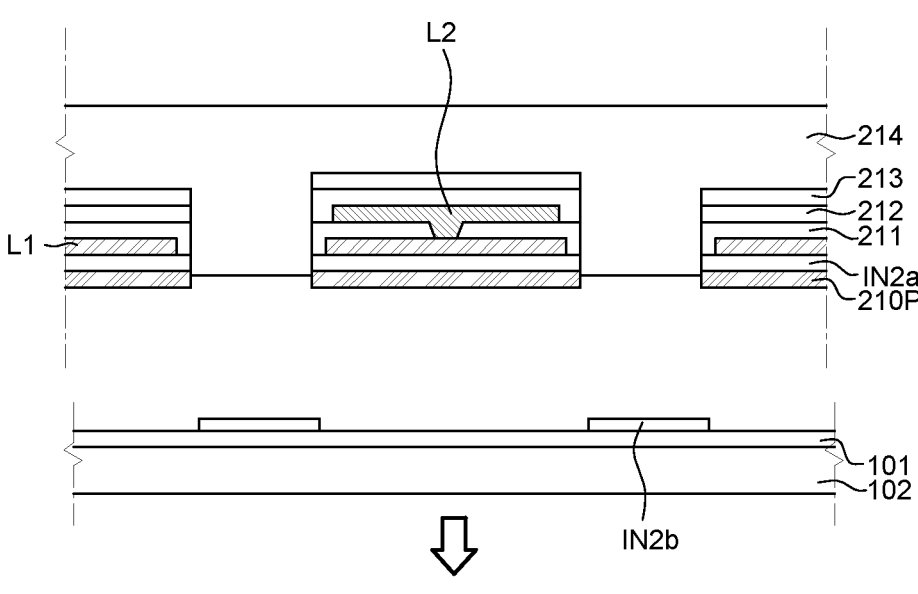

Next, referring to FIG. 9E, the LLO process is performed to separate the temporary substrate 102 and the temporary insulating pattern IN2b from the substrate pattern 210P. The temporary insulating pattern IN2b disposed on a lowermost portion of the plurality of inorganic insulating patterns is formed of silicon oxide SiO2. Accordingly, during the LLO, the temporary insulating pattern IN2b and the sacrificial layer 101 which are in contact with the side surface or the lower surface of the substrate pattern 210P are decomposed by the laser so that the temporary substrate 102 is detached to the arrow direction illustrated in FIG. 9E.

Next, referring to FIG. 9F, the adhesive layer 150 is disposed on a lower surface of the substrate pattern 210P. Accordingly, the over coating layer 214 is spaced apart from the adhesive layer 150. The air gap H2 which is enclosed by the substrate pattern 210P may be formed between the over coating layer 214 and the adhesive layer 150. Further, the polarizer 160 which suppresses the reflection of external light or a barrier film which suppresses the permeation of foreign material may be disposed on the lower surface of the adhesive layer 150.

Therefore, in the display device 200 according to another exemplary embodiment of the present disclosure, a plurality of substrate patterns 210P are formed of any one of a transparent conducting oxide and an oxide semiconductor to perform a LLO process. At this time, the transparent conducting oxide and the oxide semiconductor are materials which may perform the LLO process with the temporary insulating pattern IN2B, the sacrificial layer 101, and the temporary substrate 102. Therefore, even though the substrate is formed of any one of the transparent conducting oxide and the oxide semiconductor, the plurality of substrate patterns 210P may be easily separated from the temporary substrate 102. Further, using a characteristic that during the LLO, the temporary insulating pattern IN2b formed of silicon oxide is detached from the substrate pattern 210P and the over coating layer 214, the air gap H2 enclosed by the substrate pattern 210P may be formed between the adhesive layer 150 and the over coating layer 214.

Next, an area of the non-active area NA in which a pad unit is disposed will be described in more detail with reference to FIGS. 10 to 11B together.

Figure 10:
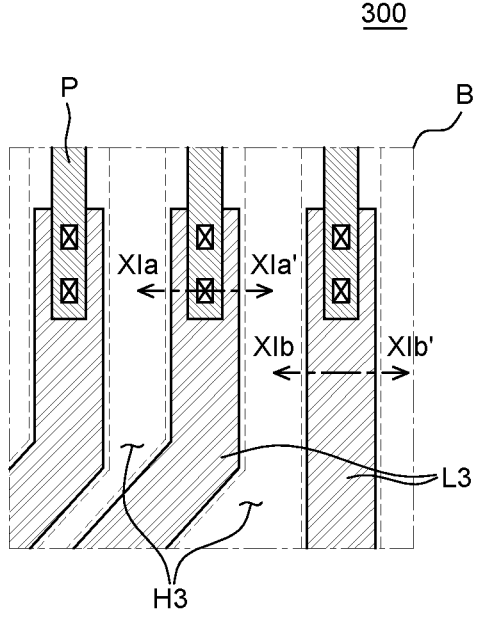
FIG. 10 is an enlarged plan view of a display device according to still another exemplary embodiment of the present disclosure.
Figure 11A:
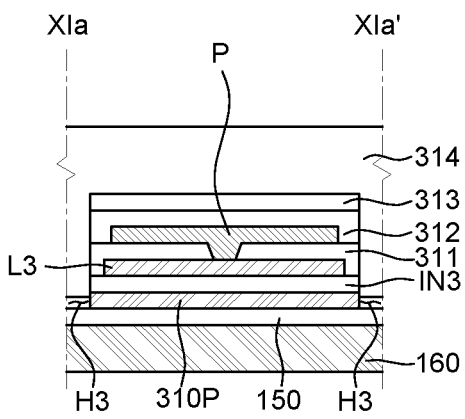
FIG. 11A is a cross-sectional view taken along XIa-XIa' of FIG. 10.

FIG. 10 is an enlarged plan view of a display device according to still another exemplary embodiment of the present disclosure. FIG. 11A is a cross-sectional view taken along XIa-XIa' of FIG. 10 and FIG. 11B is a cross-sectional view taken along the line XIb-XIb' of FIG. 10. FIG. 10 is an enlarged plan view of a partial area of a pad unit in a non-active area NA of a display device 300 according to still another exemplary embodiment of the present disclosure, and for example, an enlarged plan view corresponding to an area B of FIG. 1. In FIG. 10, for the convenience of description, with regard to the substrate, only an air gap H3 excluding a plurality of substrate pattern 310P is illustrated. Referring to FIGS. 10, 11A, and 11B, the display device 300 according to another exemplary embodiment of the present disclosure includes a plurality of substrate patterns 310P, an insulating pattern IN3, a buffer pattern 311, a gate insulating pattern 312, a passivation pattern 313, an over collating layer 314, an adhesive layer 150, a polarizer 160, a third wiring line L3, and a pad P.

In the non-active area NA, the plurality of third wiring lines L3 which are electrically connected to the plurality of pads P are link lines. The plurality of third wiring lines L3 connect the wiring lines such as a data line DL or a gate line GL to the plurality of pads P.

Referring to FIG. 11A together, it is illustrated that the plurality of third wiring lines L3 are disposed on the same layer as the light shielding layer LS and formed of the same material as the light shielding layer LS. However, the plurality of third wiring lines L3 may be formed of the same material on the same layer as any one selected from the gate electrodes GE1, GE2, GE3, the source electrodes SE1, SE2, SE3, the drain electrodes DE1, DE2, DE3, and the light shielding layer LS.

Figure 11B:
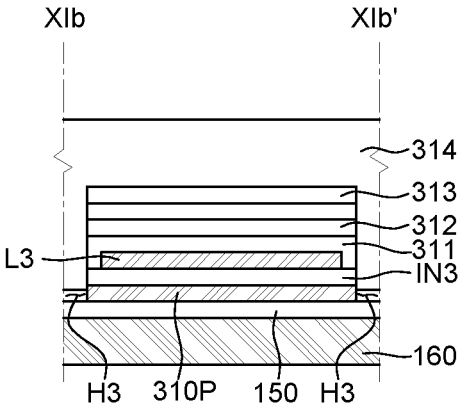
FIG. 11B is a cross-sectional view taken along the line XIb-XIb' of FIG. 10.

Referring to FIGS. 11A and 11B, a plurality of insulating patterns IN3 are disposed between the plurality of substrate patterns 310P and the plurality of third wiring lines L3. That is, the plurality of substrate patterns 310P may be disposed so as to overlap the plurality of third wiring lines L3 and the insulating layer IN includes a plurality of insulating patterns IN3. In the pad unit, the plurality of substrate patterns 310P, the plurality of insulating patterns IN3 on the plurality of substrate patterns 310P, and the plurality of third wiring lines L3 on the plurality of insulating patterns IN3 may be disposed. At this time, widths of the plurality of insulating patterns IN3 may be equal to those of the plurality of substrate patterns 310P, but are not limited thereto.

The plurality of buffer patterns 311 may be disposed between the plurality of third wiring lines L3 and the plurality of pads P. That is, the buffer layer includes the plurality of buffer patterns 311. The plurality of pads P may be electrically connected to the plurality of third wiring lines L3 by means of a contact hole disposed in the plurality of buffer patterns 311. At this time, widths of the plurality of buffer patterns 311 may be equal to those of the plurality of substrate patterns 310P, but are not limited thereto.

In the non-active area NA, the plurality of pads P are disposed on the plurality of buffer patterns 311. The plurality of patterns P supply a power voltage and a data voltage to the plurality of sub pixels SP of the active area AA. The plurality of pads P are connected to the printed circuit board by means of the flexible film. It is illustrated that the plurality of pads P are formed of the same conductive material as the gate electrodes GE1, GE2, GE3, but it is not limited thereto.

A plurality of gate insulating patterns 312 are disposed on the plurality of pads P and a plurality of passivation patterns 313 is disposed on the plurality of gate insulating patterns 312. That is, the gate insulating layer includes the plurality of gate insulating patterns 312 and the passivation layer includes the plurality of passivation patterns 313. At this time, widths of the plurality of gate insulating patterns 312 and widths of the plurality of passivation patterns 313 may be equal to those of the plurality of substrate patterns 310P, but are not limited thereto.

The over coating layer 314 is disposed between the plurality of insulating patterns IN3 and on the plurality of first wiring lines L1, and the over coating layer 314 is spaced apart from the adhesive layer 150. The over coating layer 314 is disposed on the passivation pattern 313, between the plurality of substrate patterns 310P, between the plurality of insulating patterns IN3, between the plurality of third wiring lines L3, between the plurality of buffer patterns 311, between the plurality of pads P, between the plurality of gate insulating patterns 312, and between the plurality of passivation patterns 313. However, the over coating layer 314 is not filled in the entire space disposed in an area between the plurality of substrate patterns 310P, but filled only in a part of a side surface adjacent to an upper surface of the plurality of substrate patterns 310P. Accordingly, the over coating layer 314 is spaced apart from the adhesive layer 150 to form the air gap H3. That is, unlike the active area AA in which the inorganic insulating layer is disposed on the air gap H1, the over coating layer 314 which is an organic insulating layer may be disposed on the air gap H3 of the non-active area NA.

A lower surface of the over coating layer 314 is spaced apart from the adhesive layer 150 and is in contact with side surfaces of the plurality of substrate patterns 310P. In other words, the over coating layer 314 is filled in a space disposed in an area between the plurality of substrate patterns 310P, but is filled so as to be in contact with only a part of the side surface adjacent to the upper surface of the plurality of substrate patterns 310P. Therefore, the over coating layer is spaced apart from the adhesive layer 150 to form the air gap H3. Therefore, the air gap H3 may be defined by the adhesive layer 150, the over coating layer 314, and the plurality of substrate patterns 310P. Further, the air gap H3 disposed in the pad unit may be formed by the same method as FIGS. 9A to 9E.

In the display device 300 according to still another exemplary embodiment of the present disclosure, the plurality of substrate patterns 310P are disposed in an area overlapping the third wiring line L3 or the pad P in the non-active area NA in which the pad unit is disposed and the air gap H3 is disposed in the remaining area. Therefore, the crack generated in the insulating layer or the connection line due to the shear stress caused by the deformation of the polarizer 160 or the barrier film may be minimized. That is, the air gap H3 disperses or blocks the shear stress caused by the deformation of the polarizer 160 or the barrier film so that the crack of the display device may be suppressed. Further, using a characteristic that during the LLO, the temporary insulating pattern formed of silicon oxide is detached from the substrate pattern 310P and the over coating layer 314, the air gap H3 enclosed by the substrate pattern 310P may be easily formed between the adhesive layer 150 and the over coating layer 314.

The exemplary embodiments of the present disclosure can also be described as follows:

According to an aspect of the present disclosure, a display device, comprising: a substrate which includes an active area including a plurality of sub pixels and a non-active area and is formed of one of a transparent conducting oxide layer and an oxide semiconductor layer; a film member disposed below the substrate; an adhesive layer disposed between the film member and the substrate; and an insulating layer disposed on the substrate; the substrate includes a plurality of substrate patterns, and an air gap defined by the plurality of substrate patterns, the insulating layers, and the adhesive layer is disposed on the adhesive layer.

The display device further comprising a plurality of first wiring lines disposed on the plurality of substrate patterns in the non-active area, the insulating layer includes: a plurality of first insulating patterns disposed between the plurality of substrate patterns and the plurality of first wiring lines; and an over coating layer disposed between the plurality of first insulating patterns and on the adhesive layer, and the over coating layer may be spaced apart from the adhesive layer.

The display device further comprising a plurality of second wiring lines disposed on the plurality of substrate patterns in the non-active area, the insulating layer further includes a plurality of second insulating patterns disposed between the plurality of first wiring lines and the plurality of second wiring lines, the plurality of first wiring lines extends in a first direction and the plurality of second wiring lines extends in a second direction intersecting the first direction, the plurality of second wiring lines is electrically connected to the plurality of first wiring lines by means of a contact hole disposed in the plurality of second insulating patterns, and the over coating layer may be disposed between the plurality of second insulating patterns and on the plurality of second wiring lines.

The display device further comprising a plurality of third wiring lines which connects the plurality of sub pixels to a pad disposed at one side of the non-active area, in the non-active area, the insulating layer includes: the plurality of first insulating patterns disposed between the plurality of substrate patterns and the plurality of third patterns; and the over coating layer disposed between the plurality of first insulating patterns and on the plurality of third wiring lines, and the over coating layer may be spaced apart from the adhesive layer.

A lowermost insulating pattern, among the plurality of first insulating patterns, may be formed of silicon oxide ($SiO_2$).

A lower surface of the over coating layer may be in contact with a side surface of the plurality of substrate patterns.

The plurality of sub pixels includes an emission area and a circuit area, the plurality of substrate patterns is disposed in the emission area in the plurality of sub pixels, and the air gap may be disposed in the circuit area.

The insulating layer may include an inorganic insulating layer disposed on the plurality of substrate patterns and the air gap.

The film member may include at least one of a polarizer and a barrier film.

According to another aspect of the present disclosure, a display device, comprising: a substrate which includes an active area including a plurality of sub pixels and a non-active area adjacent to the active area and including a gate driver and a pad unit and is formed of one of a transparent conducting oxide layer and an oxide semiconductor layer; a film member disposed below the substrate; an adhesive layer disposed between the film member and the substrate; and an insulating layer disposed on the substrate; in the non-active area, a plurality of first wiring lines which transmits a signal from the pad unit to the gate driver, a plurality of second wiring lines which connects the gate driver and the plurality of first wiring lines, and a plurality of third wiring lines which transmits a signal from the pad unit to the plurality of sub pixels are disposed, the active area includes an emission area and a circuit area, the substrate includes a plurality of substrate patterns disposed in an area overlapping the plurality of first wiring lines, the plurality of second wiring lines, and the plurality of third wiring lines and an emission area, and an air gap defined by the plurality of substrate patterns, the insulating layers, and the adhesive layer is disposed on the adhesive layer.

In the non-active area, the insulating layer includes: a plurality of first insulating patterns disposed between the plurality of substrate patterns and the plurality of first patterns; and an over coating layer disposed between the plurality of first insulating patterns and on the plurality of first wiring lines, and the over coating layer may be spaced apart from the adhesive layer.

The display device further comprising a plurality of second insulating patterns disposed above the first insulating pattern and disposed between the plurality of first wiring lines and the plurality of second wiring lines, the over coating layer may be disposed between the plurality of second insulating patterns and on the plurality of second wiring lines The insulating layer includes: the plurality of first insulating patterns disposed between the plurality of substrate patterns and the plurality of third patterns; and the over coating layer disposed between the plurality of first insulating patterns and on the plurality of third wiring lines, and the over coating layer may be spaced apart from the adhesive layer.

The insulating layer may include an inorganic insulating layer disposed on the plurality of substrate patterns and the air gap in the active area.

The film member may include at least one of a polarizer and a barrier film.

According to still another embodiment, a display device comprises a substrate which includes an active area including a plurality of sub pixels and a non-active area, the substrate formed of one of a transparent conducting oxide layer and an oxide semiconductor layer and including a plurality of substrate patterns; a film member disposed below the substrate; an insulating layer disposed on the substrate; and an airgap disposed between the insulating layer and the film member.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate which includes an active area including a plurality of sub pixels and a non-active area, the substrate formed of one of a transparent conducting oxide layer or an oxide semiconductor layer;
a film member disposed below the substrate;
an adhesive layer disposed between the film member and the substrate;
an insulating layer disposed on the substrate; and
a thin film transistor disposed on the insulating layer, the thin film transistor including an active layer;
wherein the substrate includes a plurality of substrate patterns, and
an air gap defined by the plurality of substrate patterns, the insulating layer, and the adhesive layer, the airgap disposed between the insulating layer and the adhesive layer, and the insulating layer disposed above a top of the airgap, and the adhesive layer disposed below a bottom of the airgap.

2. The display device according to claim 1, further comprising:
a plurality of first wiring lines disposed on a portion of the plurality of substrate patterns in the non-active area,
wherein the insulating layer includes:
a plurality of first insulating patterns disposed between the portion of the plurality of substrate patterns and the plurality of first wiring lines; and
an over coating layer disposed between the plurality of first insulating patterns and on the adhesive layer, and
the over coating layer is spaced apart from the adhesive layer.

3. The display device according to claim 2, further comprising:
a plurality of second wiring lines disposed on the portion of the plurality of substrate patterns in the non-active area,
wherein the insulating layer further includes a plurality of second insulating patterns disposed between the plurality of first wiring lines and the plurality of second wiring lines, the plurality of first wiring lines extend in a first direction and the plurality of second wiring lines extend in a second direction intersecting the first direction, the plurality of second wiring lines are electrically connected to the plurality of first wiring lines through a contact hole disposed in the plurality of second insulating patterns, and the over coating layer is disposed between the plurality of second insulating patterns and on the plurality of second wiring lines.

4. The display device according to claim 3, further comprising:
a plurality of third wiring lines which connects the plurality of sub pixels to a pad disposed in the non-active area,
wherein the insulating layer further includes:
a plurality of third insulating patterns disposed between the plurality of substrate patterns and the plurality of third wiring lines; and
the over coating layer disposed between the plurality of first insulating patterns and on the plurality of third wiring lines, and
the over coating layer is spaced apart from the adhesive layer.

5. The display device according to claim 2, wherein a lowermost insulating pattern, among the plurality of first insulating patterns, is formed of silicon oxide (SiO2).

6. The display device according to claim 2, wherein a lower surface of the over coating layer is in contact with a part of a side surface of the plurality of substrate patterns.

7. The display device according to claim 1, wherein the plurality of sub pixels include an emission area and a circuit area, a portion of the plurality of substrate patterns are disposed in the emission area in the plurality of sub pixels, and the air gap is disposed in the circuit area.

8. The display device according to claim 7, wherein the insulating layer includes an inorganic insulating layer disposed on the plurality of substrate patterns and the air gap.

9. The display device according to claim 1, wherein the film member includes at least one of a polarizer or a barrier film.

10. A display device, comprising:
  a substrate which includes an active area including a plurality of sub pixels and a non-active area adjacent to the active area and including a gate driver and a pad unit, the substrate formed of one of a transparent conducting oxide layer or an oxide semiconductor layer;
  a film member disposed below the substrate;
  an adhesive layer disposed between the film member and the substrate;
  an insulating layer disposed on the substrate; and
  a thin film transistor disposed on the insulating layer, the thin film transistor including an active layer;
  wherein in the non-active area, a plurality of first wiring lines which transmits a signal from the pad unit to the gate driver, a plurality of second wiring lines which connects the gate driver and the plurality of first wiring lines, and a plurality of third wiring lines which transmits a signal from the pad unit to the plurality of sub pixels are disposed, the active area includes an emission area and a circuit area, the substrate includes a plurality of substrate patterns disposed in an area overlapping the plurality of first wiring lines, the plurality of second wiring lines, and the plurality of third wiring lines and the emission area, and an air gap defined by the plurality of substrate patterns, the insulating layer, and the adhesive layer is disposed, the airgap disposed between the insulating layer and the adhesive layer, the insulating layer disposed above a top of the airgap, and the adhesive layer disposed below a bottom of the airgap.

11. The display device according to claim 10, wherein in the non-active area, the insulating layer includes:
  a plurality of first insulating patterns disposed between the plurality of substrate patterns and the plurality of first wiring lines; and
  an over coating layer disposed between the plurality of first insulating patterns and on the plurality of first wiring lines, and
  the over coating layer is spaced apart from the adhesive layer.

12. The display device according to claim 11, further comprising:
  a plurality of second insulating patterns disposed above the first insulating patterns and disposed between the plurality of first wiring lines and the plurality of second wiring lines,
  wherein the over coating layer is disposed between the plurality of second insulating patterns and on the plurality of second wiring lines.

13. The display device according to claim 12, wherein the insulating layer includes:
  a plurality of third insulating patterns disposed between the plurality of substrate patterns and the plurality of third wiring lines; and
  the over coating layer disposed between the plurality of first insulating patterns and on the plurality of third wiring lines, and
  the over coating layer is spaced apart from the adhesive layer.

14. The display device according to claim 10, wherein the insulating layer includes an inorganic insulating layer disposed on the plurality of substrate patterns and the air gap in the active area.

15. The display device according to claim 10, wherein the film member includes at least one of a polarizer or a barrier film.

16. A display device, comprising:
  a substrate which includes an active area and a non-active area, the active area including a plurality of sub pixels, the substrate formed of one of a transparent conducting oxide layer and or oxide semiconductor layer and including a plurality of substrate patterns;
  a film member disposed below the substrate;
  an insulating layer disposed on the substrate;
  a thin film transistor disposed on the insulating layer, the thin film transistor including an active layer; and
  an airgap disposed between the insulating layer and the film member, the insulating layer disposed above a top of the airgap, and the film member disposed below a bottom of the airgap.

17. The display device according to claim 16, further comprising an adhesive layer disposed between the film member and the substrate,
  wherein the airgap is spaced apart from the adhesive layer.

18. The display device according to claim 17, wherein:
  a portion of the airgap in the active area is disposed between the plurality of substrate patterns, the insulating layer, and the adhesive layer.

19. The display device according to claim 17,
  wherein the display device further comprises a plurality of first wiring lines disposed on a plurality of substrate patterns of the substrate in the non-active area, and
  wherein the insulating layer includes:
  a plurality of first insulating patterns disposed between the plurality of substrate patterns and the plurality of first wiring lines; and
  an over coating layer disposed between the plurality of first insulating patterns and on the film member, wherein a portion of the airgap is disposed between a portion of the adhesive layer in the non-active area and a portion of the over coating layer between the plurality of first insulating patterns.

20. The display device according to claim 19, further comprising a plurality of second wiring lines disposed on the plurality of substrate patterns of the substrate in the non-active area, wherein:
  the insulating layer further includes a plurality of second insulating patterns disposed between the plurality of first wiring lines and the plurality of second wiring lines,
  the plurality of first wiring lines extend in a first direction and the plurality of second wiring lines extend in a second direction intersecting the first direction, the plurality of second wiring lines are electrically connected to the plurality of first wiring lines through a contact hole disposed in the plurality of second insulating patterns, and the over coating layer is disposed between the plurality of second insulating patterns and on the plurality of second wiring lines.

21. The display device according to claim 20, further comprising a plurality of third wiring lines which connects the plurality of sub pixels to a pad disposed in the non-active area, wherein the insulating layer includes:

a plurality of third insulating patterns disposed between the plurality of substrate patterns and the plurality of third wiring lines; and the over coating layer disposed between the plurality of third insulating patterns and on the plurality of third wiring lines, wherein the portion of the airgap is disposed between the adhesive layer in the non-active area and the over coating layer disposed between the plurality of third insulating patterns.

22. The display device according to claim 19, wherein a lowermost insulating pattern, among the plurality of first insulating patterns, is formed of silicon oxide ($SiO_2$).

23. The display device according to claim 19, wherein a lower surface of the over coating layer is in contact with a part of a side surface of the plurality of substrate patterns.

24. The display device according to claim 19, wherein the plurality of sub pixels include an emission area and a circuit area, the plurality of substrate patterns are disposed in the emission area in the plurality of sub pixels, and the air gap is disposed in the circuit area in the plurality of sub pixels.

25. The display device according to claim 18, wherein the insulating layer includes an inorganic insulating layer disposed on the plurality of substrate patterns and the air gap.

26. The display device according to claim 16, wherein the film member includes at least one of a polarizer or a barrier film.

* * * * *